(12) United States Patent
Wallmueller

(10) Patent No.: US 8,341,819 B2
(45) Date of Patent: Jan. 1, 2013

(54) THERMAL PROCESSING SYSTEM AND METHOD OF USING

(75) Inventor: Andrew Wallmueller, Boynton Beach, FL (US)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 13/539,446

(22) Filed: Jul. 1, 2012

(65) Prior Publication Data

US 2012/0266425 A1  Oct. 25, 2012

Related U.S. Application Data

(62) Division of application No. 12/266,621, filed on Nov. 7, 2008, now Pat. No. 8,209,833.

(51) Int. Cl.
| | |
|---|---|
| *B25B 27/14* | (2006.01) |
| *B23Q 3/00* | (2006.01) |
| *B23Q 1/00* | (2006.01) |
| *B24B 11/00* | (2006.01) |
| *F27B 5/14* | (2006.01) |
| *B66C 17/08* | (2006.01) |

(52) U.S. Cl. ............ 29/281.1; 269/20; 269/21; 219/390
(58) Field of Classification Search .................. 29/281.1; 269/20, 21, 900; 219/390; 118/710
See application file for complete search history.

(56) References Cited

U.S. PATENT DOCUMENTS

| | | | | |
|---|---|---|---|---|
| 5,273,588 A * | 12/1993 | Foster et al. | ............... | 118/723 E |
| 5,356,476 A * | 10/1994 | Foster et al. | ................... | 118/725 |
| 5,484,011 A * | 1/1996 | Tepman et al. | ............... | 165/80.2 |
| 5,540,821 A * | 7/1996 | Tepman | ................... | 204/192.13 |
| 5,683,518 A * | 11/1997 | Moore et al. | ................... | 118/730 |
| 5,830,277 A * | 11/1998 | Johnsgard et al. | ............ | 118/725 |
| 6,093,252 A * | 7/2000 | Wengert et al. | ............... | 118/719 |
| 6,133,550 A * | 10/2000 | Griffiths et al. | ................ | 219/403 |
| 6,200,634 B1 * | 3/2001 | Johnsgard et al. | ......... | 427/248.1 |
| 6,296,711 B1 * | 10/2001 | Loan et al. | ..................... | 118/726 |
| 6,355,909 B1 * | 3/2002 | Griffiths et al. | ............... | 219/403 |
| 6,454,865 B1 * | 9/2002 | Goodman et al. | ............ | 118/728 |
| 6,608,287 B2 * | 8/2003 | Halpin et al. | .................. | 219/390 |
| 6,630,991 B2 * | 10/2003 | Kitamura et al. | ................ | 356/43 |
| 6,788,991 B2 * | 9/2004 | De Haas et al. | ............... | 700/121 |
| 6,818,864 B2 * | 11/2004 | Ptak | .............................. | 219/390 |
| 7,070,915 B2 | 7/2006 | Ho et al. | | |
| 7,173,216 B2 * | 2/2007 | Ptak | .............................. | 219/390 |
| 8,087,652 B2 * | 1/2012 | Son | ................................ | 269/266 |

* cited by examiner

*Primary Examiner* — Lee D Wilson
*Assistant Examiner* — Alvin Grant

(57) ABSTRACT

Embodiments of the invention provide a thermal processing system and methods for uniformly heating and/or cooling a semiconductor wafer. Embodiments of the invention may be applied to provide a more uniform temperature profile when processing 300 mm and larger wafers having different curvature profiles that occur at the same and/or different points in a manufacturing cycle. Wafer curvature can be dependent on the number and thickness of the metal layers.

7 Claims, 8 Drawing Sheets

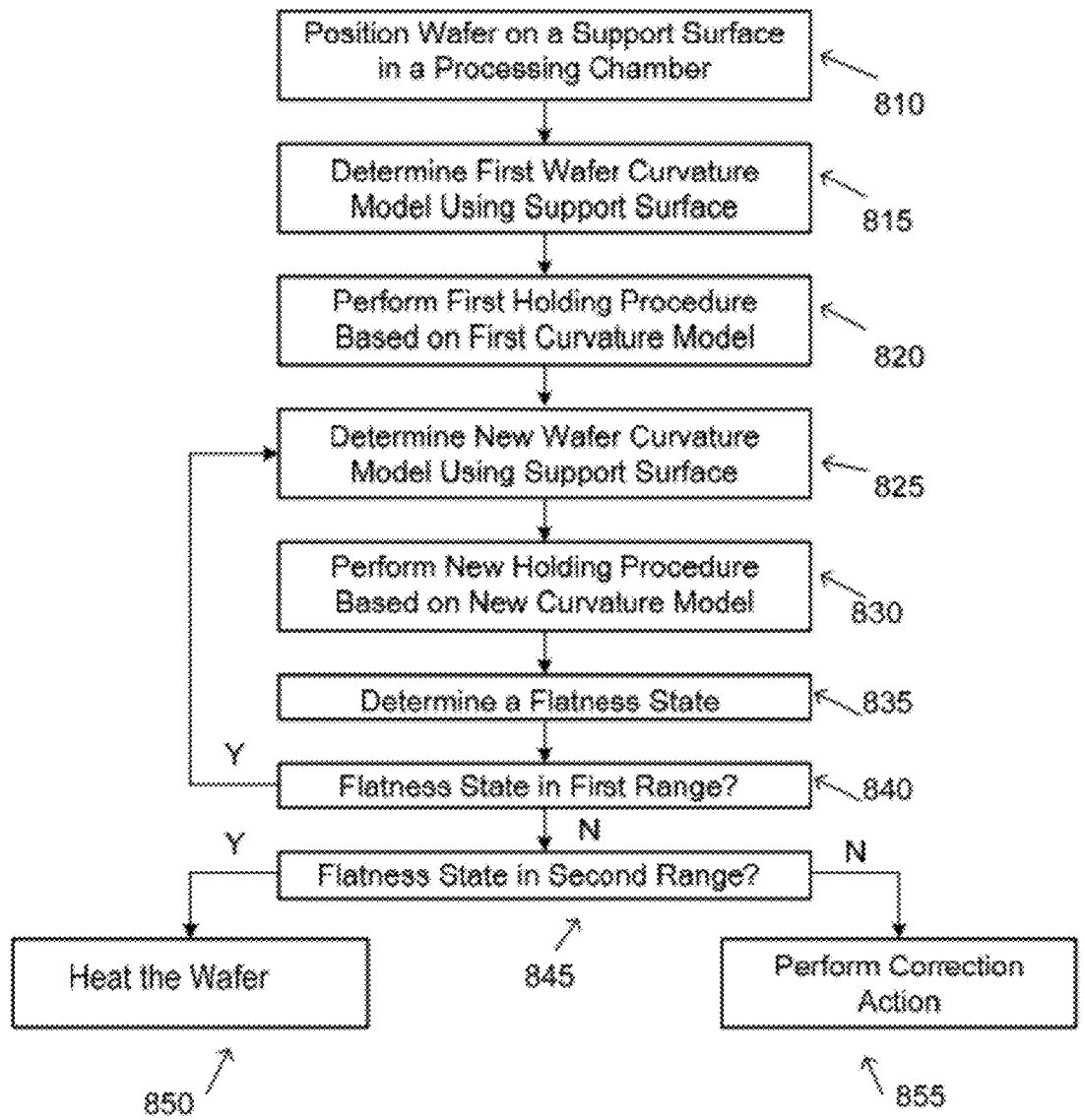
FIG. 8    800

THERMAL PROCESSING SYSTEM AND METHOD OF USING

FIELD OF THE INVENTION

The invention relates to wafer processing, and more particularly, to a thermal processing system and method for using the same.

BACKGROUND OF THE INVENTION

Minimizing defects during wafer processing will continue to be a critical path to attaining cost effective manufacturing of advanced semiconductor devices. Hard particles can block etch processes causing electrical "open" or "short" in the circuit. In lesser size and if lucky with the location on the device, the hard particle may only create fatal perturbations in the active features' critical dimension (line/space or contact hole)

The required gate level defect density for 15 nm gate technology is going to be approximately 0.01/cm**2 at 10 nm in size per the International Technology Roadmap for Semiconductors (ITRS) 2005 roadmap. Prior art thermal processing procedures are not adequate to meet these requirements, and it is anticipated that an improved thermal processing system and associated procedures will be required to meet the future device defect densities.

SUMMARY OF THE INVENTION

Embodiments of the invention provide a thermal processing system and methods for heating and/or cooling a semiconductor wafer. Embodiments of the invention may be applied to thermally processing wafers at different points in a manufacturing cycle, and the wafers can include one or more metal layers.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 8 illustrates a simplified process flow diagram for a method for using a thermal processing system according to embodiments of the invention.

DETAILED DESCRIPTION OF SEVERAL EMBODIMENTS

Embodiments of the invention provide a method and processing system for controlling and rapidly lowering the temperature of a hotplate used for supporting and heating-treating wafers. Embodiments of the invention may be applied to heat-treating of resist-coated wafers with high wafer throughput. The terms "wafer" and "substrate" are used interchangeably herein to refer to a thin slice of material, such as a silicon crystal or glass material, upon which microcircuits are constructed, for example by diffusion, deposition, and etching of various materials.

Figure 1:
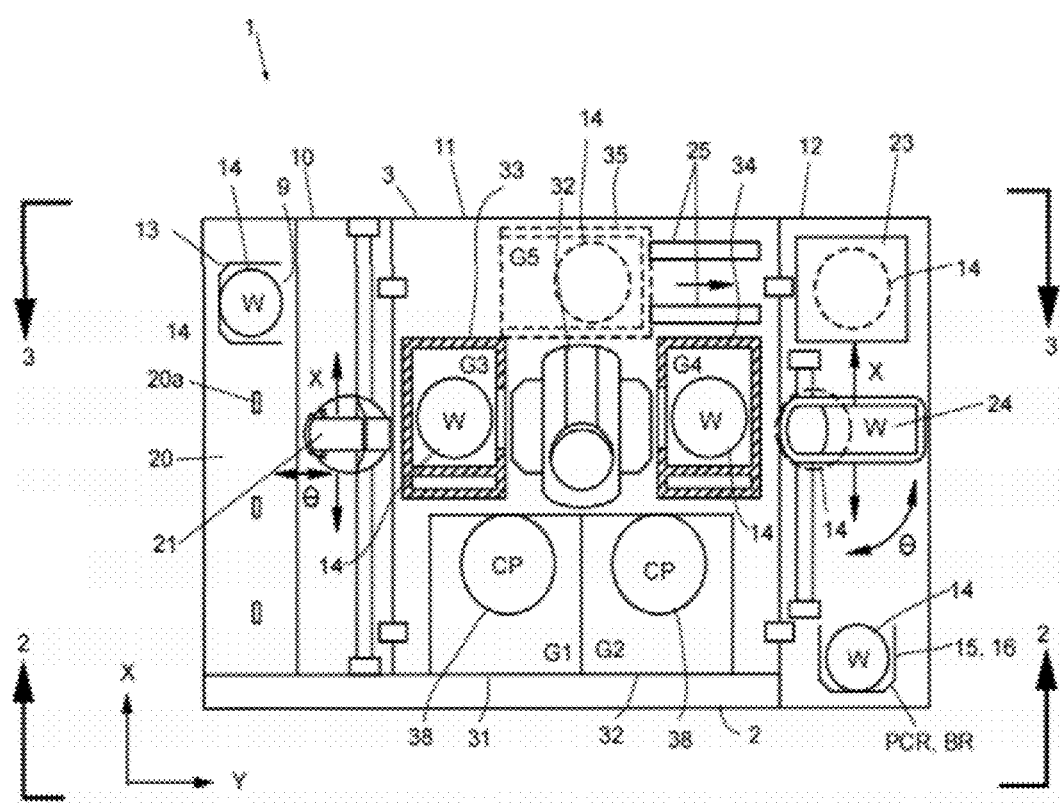
FIG. 1 is a top view of a schematic diagram of a coating/developing system for use in accordance with embodiments of the invention.
Figure 2:
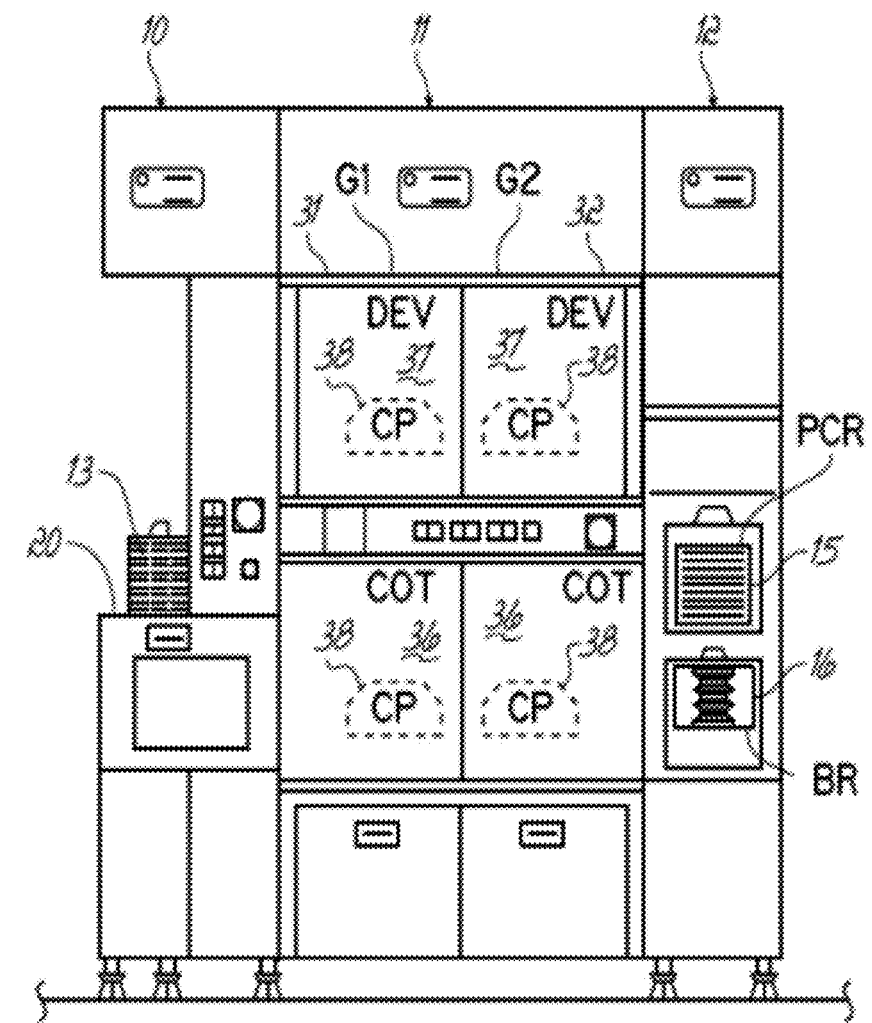
FIG. 2 is a front view of the coating/developing system of FIG. 1.
Figure 3:
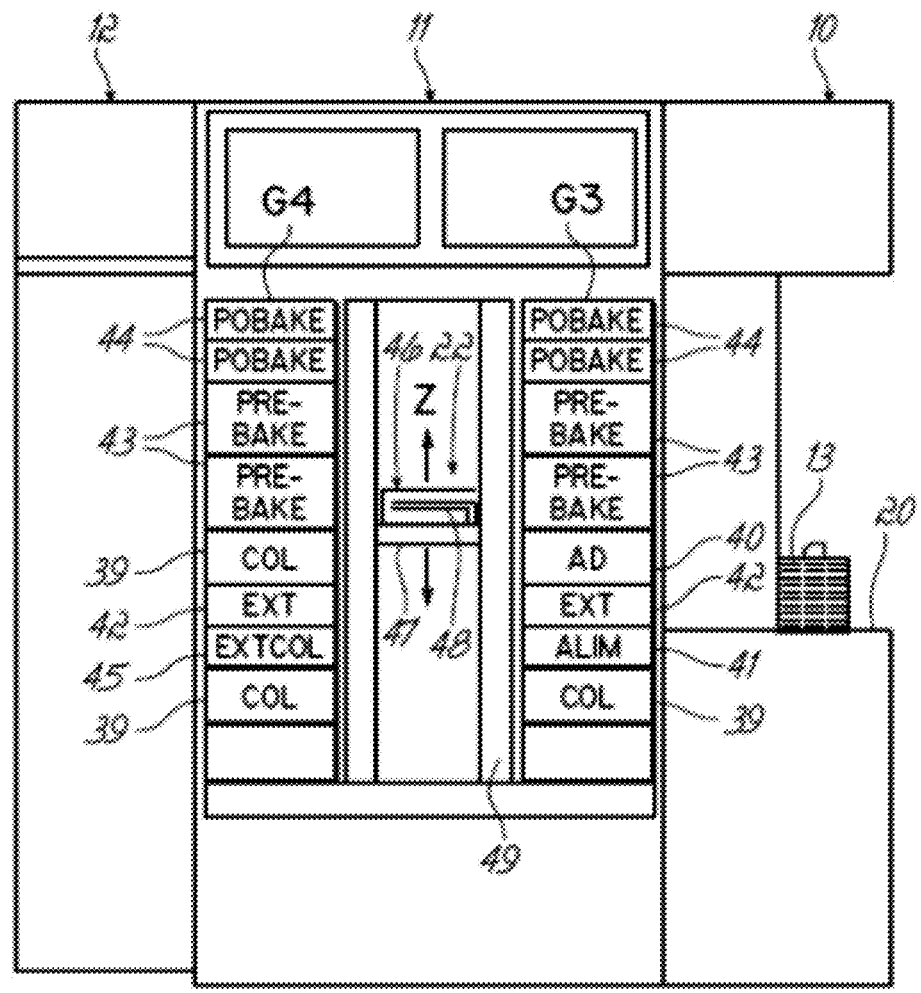
FIG. 3 is a partially cut-away back view of the coating/developing system of FIG. 1, as taken along line 3-3.

With reference to FIGS. 1-3, a coating/developing processing system 1 has a load/unload section 10, a process section 11, and an interface section 12. The load/unload section 10 has a cassette table 20 on which cassettes (CR) 13, each storing a plurality of semiconductor wafers (W) 14 (e.g., 25), are loaded and unloaded from the processing system 1. The process section 11 has various single wafer processing units for processing wafers 14 sequentially one by one. These processing units are arranged in predetermined positions of multiple stages, for example, within first (G1), second (G2), third (G3), fourth (G4) and fifth (G5) multiple-stage process unit groups 31, 32, 33, 34, 35. The interface section 12 is interposed between the process section 11 and one or more light exposure systems (not shown), and is configured to transfer resist coated wafers between the process section 11 and the one or more light exposure systems. The one or more light exposure systems can include a resist patterning system such as a photolithography tool that transfers the image of a circuit or a component from a mask or onto a resist on the wafer surface.

The coating/developing processing system 1 also includes a CD metrology system for obtaining CD metrology data from test areas on the patterned wafers. The CD metrology system may be located within the processing system 1, for example at one of the multiple-stage process unit groups 31, 32, 33, 34, 35. The CD metrology system can be a light scattering system such as an Optical Digital Profilometry (ODP) system.

The ODP system may include a scatterometer, incorporating beam profile ellipsometry (ellipsometer), and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). ODP software is available from Timbre Technologies Inc. (2953 Bunker Hill Lane, Santa Clara, Calif. 95054).

When performing optical metrology, such as Scatterometry, a structure on a substrate, such as a semiconductor wafer or flat panel, is illuminated with electromagnetic (EM) radiation, and a diffracted signal received from the structure is utilized to reconstruct the profile of the structure. The structure may include a periodic structure, or a non-periodic structure. Additionally, the structure may include an operating structure on the substrate (i.e., a via, or contact hole, or an interconnect line or trench, or a feature formed in a mask layer associated therewith), or the structure may include a periodic grating or non-periodic grating formed proximate to an operating structure formed on a substrate. For example, the periodic grating can be formed adjacent a transistor formed on the substrate. Alternatively, the periodic grating can be formed in an area of the transistor that does not interfere with the operation of the transistor. The profile of the periodic grating is obtained to determine whether the periodic grating, and by extension the operating structure adjacent the periodic grating, has been fabricated according to specifications.

Still referring to FIGS. 1-3, a plurality of projections 20a are formed on the cassette table 20. A plurality of cassettes 13 are each oriented relative to the process section 11 by these projections 20a. Each of the cassettes 13 mounted on the cassette table 20 has a load/unload opening 9 facing the process section 11.

The load/unload section 10 includes a first sub-arm mechanism 21 that is responsible for loading/unloading the wafer W into/from each cassette 13. The first sub-arm mechanism 21 has a holder portion for holding the wafer 14, a back and forth moving mechanism (not shown) for moving the holder portion back and forth, an X-axis moving mechanism (not shown) for moving the holder portion in an X-axis direction, a Z-axis moving mechanism (not shown) for moving the holder portion in a Z-axis direction, and a θ (theta) rotation mechanism (not shown) for rotating the holder portion around the Z-axis. The first sub-arm mechanism 21 can gain access to an alignment unit (ALIM) 41 and an extension unit (EXT) 42 belonging to a third (G3) process unit group 33, as further described below.

With specific reference to FIG. 3, a main arm mechanism 22 is liftably arranged at the center of the process section 11. The process units G1-G5 are arranged around the main arm mechanism 22. The main arm mechanism 22 is arranged within a cylindrical supporting body 49 and has a liftable wafer transporting system 46. The cylindrical supporting body 49 is connected to a driving shaft of a motor (not shown). The driving shaft may be rotated about the Z-axis in synchronism with the wafer transporting system 46 by an angle of θ. The wafer transporting system 46 has a plurality of holder portions 48 movable in a front and rear direction of a transfer base table 47.

Units belonging to first (G1) and second (G2) process unit groups 31, 32, are arranged at the front portion 2 of the coating/developing processing system 1. Units belonging to the third (G3) process unit group 33 are arranged next to the load/unload section 10. Units belonging to a fourth (G4) process unit group 34 are arranged next to the interface section 12. Units belonging to a fifth (G5) process unit group 35 are arranged in a back portion 3 of the processing system 1.

With reference to FIG. 2, the first (G1) process unit group 31 has two spinner-type process units for applying a predetermined treatment to the wafer 14 mounted on a spin chuck (not shown) within the cup (CP) 38. In the first (G1) process unit group 31, for example, a resist coating unit (COT) 36 and a developing unit (DEV) 37 are stacked in two stages sequentially from the bottom. In the second (G2) process unit group 32, two spinner type process units such as a resist coating unit (COT) 36 and a developing unit (DEV) 37, are stacked in two stages sequentially from the bottom. In an exemplary embodiment, the resist coating unit (COT) 36 is set at a lower stage than the developing unit (DEV) 37 because a discharge line (not shown) for the resist waste solution is desired to be shorter than a developing waste solution for the reason that the resist waste solution is more difficult to discharge than the developing waste solution. However, if necessary, the resist coating unit (COT) 36 may be arranged at an upper stage relative to the developing unit (DEV) 37.

With reference to FIG. 3, the third (G3) process unit group 33 has a cooling unit (COL) 39, an alignment unit (ALIM) 41, an adhesion unit (AD) 40, an extension unit (EXT) 42, two prebaking units (PREBAKE) 43, and two postbaking units (POBAKE) 44, which are stacked sequentially from the bottom. Similarly, the fourth (G4) process unit group 34 has a cooling unit (COL) 39, an extension-cooling unit (EXTCOL) 45, an extension unit (EXT) 42, another cooling unit (COL) 39, two prebaking units (PREBAKE) 43 and two postbaking units (POBAKE) 44 stacked sequentially from the bottom. Although, only two prebaking units 43 and only two postbaking units 44 are shown, G3 and G4 may contain any number of prebaking units 43 and postbaking units 44. Furthermore, any or all of the prebaking units 43 and postbaking units 44 may be configured to perform post exposure bake (PEB), post application bake (PAB), and post developing bake (PDB) processes.

In an exemplary embodiment, the cooling unit (COL) 39 and the extension cooling unit (EXTCOL) 45, to be operated at low processing temperatures, are arranged at lower stages, and the prebaking unit (PREBAKE) 43, the postbaking unit (POBAKE) 44 and the adhesion unit (AD) 40, to be operated at high temperatures, are arranged at the upper stages. With this arrangement, thermal interference between units may be reduced. Alternatively, these units may have different arrangements.

At the front side of the interface section 12, a movable pick-up cassette (PCR) 15 and a non-movable buffer cassette (BR) 16 are arranged in two stages. At the backside of the interface section 12, a peripheral light exposure system 23 is arranged. The peripheral light exposure system 23 can contain a lithography tool. Alternatively, the lithography tool and the ODP system may be remote to and cooperatively coupled to the coating/developing processing system 1. At the center portion of the interface section 12, a second sub-arm mechanism 24 is provided, which is movable independently in the X and Z directions, and which is capable of gaining access to both cassettes (PCR) 15 and (BR) 16 and the peripheral light exposure system 23. In addition, the second sub-arm mechanism 24 is rotatable around the Z-axis by an angle of θ and is designed to be able to gain access not only to the extension unit (EXT) 42 located in the fourth (G4) process unit group 34 but also to a wafer transfer table (not shown) near a remote light exposure system (not shown).

In the processing system 1, the fifth (G5) process unit group 35 may be arranged at the back portion 3 of the backside of the main arm mechanism 22. The fifth (G5) process unit group 35 may be slidably shifted in the Y-axis direction along a guide rail 25. Since the fifth (G5) process unit group 35 may be shifted as mentioned, maintenance operation may be applied to the main arm mechanism 22 easily from the backside.

The prebaking unit (PREBAKE) 43, the postbaking unit (POBAKE) 44, and the adhesion unit (AD) 40 each comprise a heat treatment system in which wafers 14 are heated to temperatures above room temperature. In some embodiments, the thermal processing systems described herein can be configured for use in processing system 1.

Figure 4B:
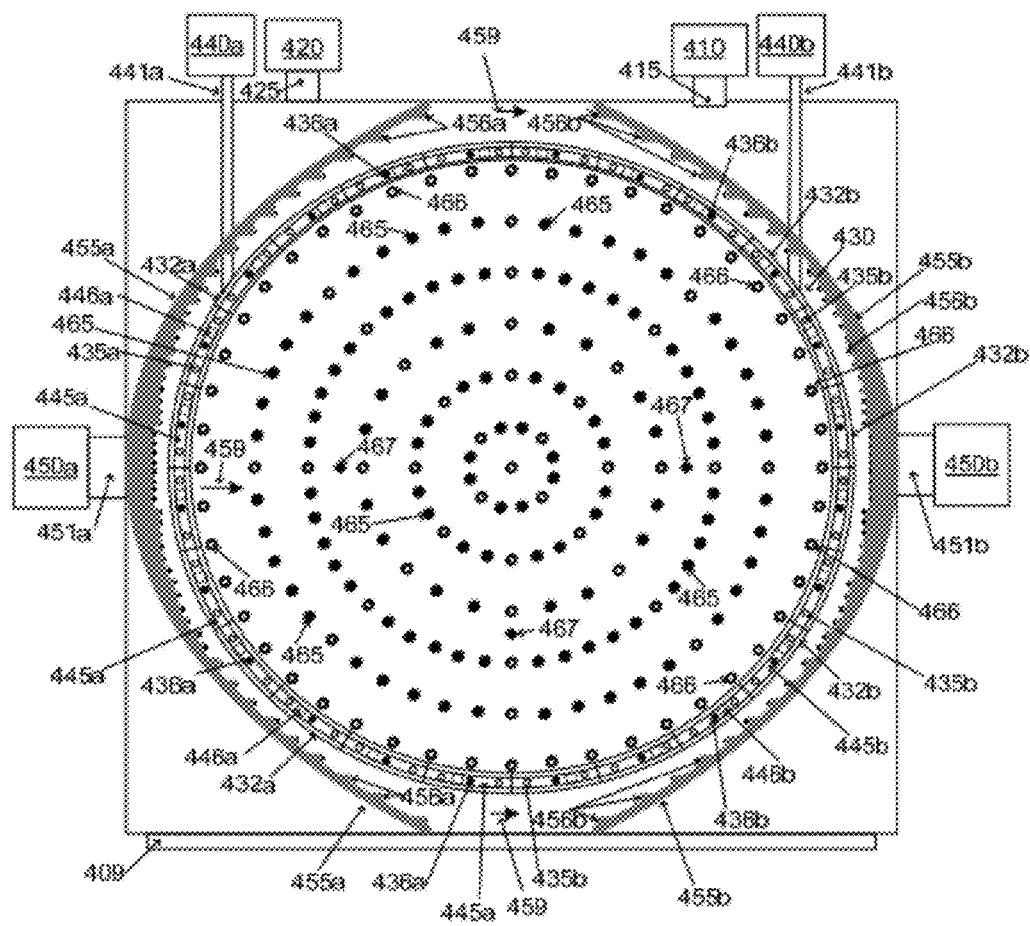
FIG. 4a and FIG. 4b show exemplary block diagrams of a thermal processing system in accordance with embodiments of the invention.
Figure 4A:
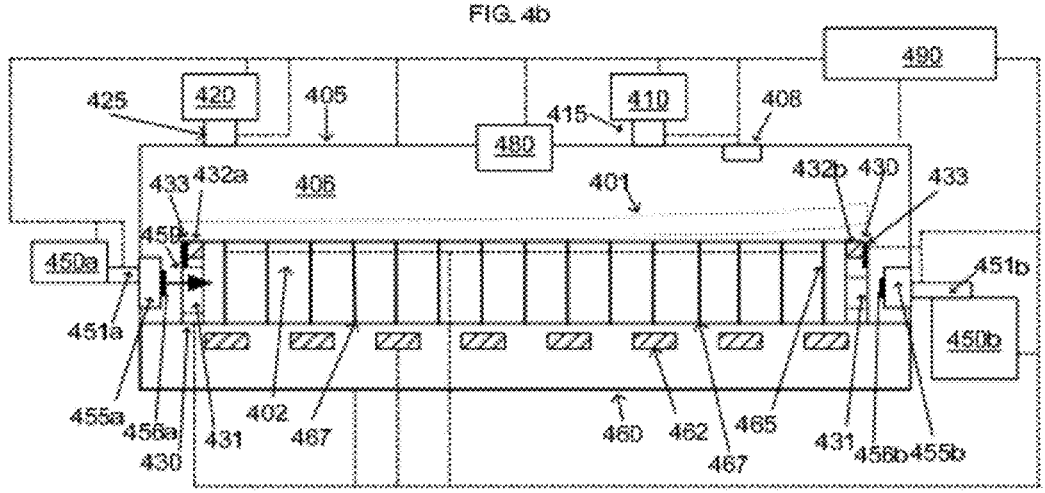

FIG. 4a and FIG. 4b show exemplary block diagrams of a thermal processing system in accordance with embodiments of the invention. In the illustrated embodiment, simplified block diagrams are used for illustration purposes and a simplified thermal processing system 400 is shown that comprises a processing chamber 405, a process gas supply system 410, an evacuation system 420, a support ring 430, one or more vacuum systems (440a, 440b), one or more thermal control systems (450a, 450b), a base plate 460, a plurality of support pins 465, a plurality of sensor pins 466, and a plurality of lift pins 467. Alternatively, lift pins 467 may not be required. In addition, the thermal processing system 400 can include one or more controllers 490 that can be used to operate and maintain the thermal processing system 400.

The thermal processing system 400 can include one or more process gas supply systems 410 coupled to the process space 406 in the processing chamber 405 using one or more flow control elements 415. For example, the flow control elements 415 may comprise one or more valves (not shown) and/or one or more input sensors (not shown). Those skilled in the art will recognize that one or more nozzles, one or more showerhead devices, and/or one or more valves may be used for controlling flow in and/or out of the process space 406, and one or more input sensors may be used for determining the processing state for the thermal processing system 400. In addition, one or more of the flow control elements 415 may comprise flexible hoses. One or more of the controllers 490 can be coupled to one or more process gas supply systems 410 and the associated flow control elements 415. The process gas supply systems 410 and the associated flow control elements 415 can be used to provide process gases and/or liquids to process space 406. One or more of the controllers 490 can be used to control the types of process gases in the process space during operational procedures or maintenance procedures.

The thermal processing system 400 can include one or more evacuation systems 420 coupled to the process space 406 in the processing chamber 405 using one or more evacuation ports 425. For example, the exhaust port 425 may comprise one or more valves (not shown) and/or one or more exhaust sensors (not shown). Those skilled in the art will recognize that one or more pumps and one or more valves may be used for controlling flow in and/or out of the process space 406, and one or more exhaust sensors may be used for determining the processing state for the thermal processing system 400. In addition, one or more of the evacuation ports 425 may be coupled to an evacuation unit (not shown) and/or an exhaust system (not shown) using flexible hoses. Evacuation port 425 can be used to exhaust cleaning and/or other processing gasses that must be removed from the process space 406. Port diameter can range from approximately 1 mm to approximately 10 mm.

One or more of the controllers 490 can be coupled to the evacuation systems 420 and the associated evacuation ports 425. The evacuation systems 420 and the associated evacuation ports 425 can be used to remove process gasses from the process space 406. One or more of the controllers 490 can control the process pressure and/or types of process gases in the process space 406 during operational procedures or maintenance procedures using one or more of the evacuation systems 420 and the associated evacuation ports 425.

The support ring 430 can comprise a plurality of vacuum holding elements (432a and 432b) and each vacuum holding element can comprise one or more vacuum ports (435a, 435b) and one or more holding sensors (436a, 436b). The holding force (vacuum pressure) in each of the vacuum holding elements (432a and 432b) can be individually measured and controlled. The inside diameter of the support ring 430 can vary from approximately 290 mm to approximately 298 mm, the outside diameter of the support ring 430 can vary from approximately 305 mm to approximately 315 mm. The diameter of the vacuum ports (435a, 435b) can vary from approximately 2 mm to approximately 5 mm. The length of the sensor pins 466 can vary from approximately 2 mm to approximately 10 mm, the diameter of the support pins can vary from approximately 0.15 mm to approximately 1.0 mm.

The support ring 430 can comprise one or more heating elements 433 that can be used to independently control the temperature at the wafer edge. For example, the wafer edge temperature can be independently controlled to eliminate or control the formation of an edge bead.

The base plate 460 can be coupled to an interior surface of the processing chamber 405, and the base plate 460 can include one or more temperature control elements 462 that can be used to quickly raise or lower the temperature of the base plate 460.

The thermal processing system 400 can include a plurality of supports pins 465 and a plurality of sensor pins 466 that can be used to support the wafer 401. The plurality of support pins 465 and the plurality of sensor pins 466 can be coupled to the base plate 460. In one example, a circular configuration may be used. In various embodiments, the sensor pins 466 can include contact sensors, pressure sensors, or temperature sensors, or any combination thereof. One or more of the controllers 490 can be coupled to one or more of the support pins 465 and one or more of the sensor pins 466. When the wafer is positioned, the sensor pins 466 can be used to determine a wafer curvature model for the wafer, and the wafer curvature model can be used to determine the number, the location, and the activation times of one or more of the vacuum holding elements (432a and 432b).

The length of the support pins 465 can vary from approximately 2 mm to approximately 10 mm, the diameter of the support pins can vary from approximately 0.15 mm to approximately 1.0 mm. The length of the sensor pins 466 can vary from approximately 2 mm to approximately 10 mm, the diameter of the support pins can vary from approximately 0.15 mm to approximately 1.0 mm.

In some examples, the base plate 460 and the support pins 465 can be configured to allow the support pins 465 to move in a vertical direction, and/or the base plate and the sensor pins 466 can be configured to allow the sensor pins 466 to move in a vertical direction. For example, the amount of pin movement can be used to determine wafer curvature.

The thermal processing system 400 can include two vacuum systems (440a and 440b) that can be coupled to the support ring 430 in different halves to provide a holding means for the wafer 401. Alternatively, other holding means may be provided. A first vacuum system 440a can be coupled to a first distribution module 445a using a first vacuum coupling element 441a. The first distribution module 445a can be coupled to a first set of vacuum holding elements 432a using one or more first control elements 446a. A second vacuum system 440b can be coupled to a second distribution module 445b using a second vacuum coupling element 441b. The second distribution module 445b can be coupled to a second set of vacuum holding elements 432b using one or more second control elements 446b. Alternatively, separate vacuum systems may not be required.

The thermal processing system 400 can include a gas injection system 480 coupled to the processing chamber 405 and the controller 490. The gas injection system 480 can be configured for exposing the support ring 430, the base plate 460, the support pins 465, the sensor pins 466, and/or the lift pins 467 to an inert gas stream for rapidly cooling these components when a wafer 401 is not present in the processing chamber 405. For example, the inert gas can include argon (Ar) or nitrogen ($N_2$).

One or more of the controllers 490 can be coupled to the first vacuum system 440a, the first vacuum coupling elements 441a, the first control elements 446a, or the first set of vacuum holding elements 432a, or any combination thereof, and one or more of the controllers 490 can be coupled to the second vacuum system 440b, the second vacuum coupling elements 441b, the second control elements 446b, or the second set of vacuum holding elements 432b, or any combination thereof. In this manner, one or more of the first set of vacuum holding elements 432a and/or one or more of the second set of vacuum holding elements 432b can be used to hold the wafer 401 using vacuum techniques. Control procedures can be performed to determine which vacuum holding elements are being used during operational procedures or maintenance procedures.

In some procedures, all of the vacuum holding elements (432a and 432b) can be activated when a wafer 401 is positioned above the support ring 430 using the lift pins 467. When the wafer is lowered onto the support ring 430, one or more of the vacuum holding elements (432a and 432b) can provide a holding force to the backside of the wafer. When substantially all of the vacuum holding elements (432a and 432b) are providing substantially the same force to the backside of the wafer, a first wafer flatness state can be established, and a first wafer curvature model can be determined for a "flat" wafer. For example, when substantially all of the holding sensors (436a, 436b) are measuring substantially the same data, the first wafer flatness state can be established, and the first wafer curvature model can be determined for a "flat" wafer. When one or more of the vacuum holding elements (432a and 432b) are not providing substantially the same force to the back side of the wafer, other wafer flatness states can be established, and other wafer curvature models can be determined for a "non-uniform" wafer. For example, when one or more of the holding sensors (436a, 436b) are not measuring substantially the same data, the other wafer flatness states can be established, and the other wafer curvature models can be determined for the "non-flat" wafer.

In other procedures, the other steps can be performed. In a first step, a first number of the vacuum holding elements (432a and 432b) can be activated when a wafer is positioned above the support ring 430 using the lift pins 467. For example, the first number can be determined using a predicted wafer curvature model. In a second step, a wafer can be lowered onto the support ring 430, and one or more of the first number of vacuum holding elements (432a and 432b) can provide a holding force to the backside of the wafer. In the third step, one or more of the first number of vacuum holding elements (432a and 432b) can provide a first total holding force to the backside of the wafer, a first wafer flatness state and/or a first wafer curvature model can be determined for a "partially held" wafer. For example, when one or more of the first number of holding sensors (436a, 436b) are measuring substantially the same data, the first wafer flatness state can be established for the "partially held" wafer, and the first wafer curvature model can be determined for the "partially held" wafer. In a fourth step, a new number of the vacuum holding elements (432a and 432b) can be activated, and the new number can be determined using the first wafer curvature model. In a fifth step, one or more of the new number of vacuum holding elements (432a and 432b) can provide a new total holding force to the back side of the wafer, a new wafer flatness state and/or a new wafer curvature model can be determined using the new total holding force. For example, when one or more of the new number of holding sensors (436a, 436b) are measuring data, the new wafer curvature model can be determined for the "partially held" wafer. In a sixth step, the new wafer flatness state can be compared to a flatness limit. Then, the fourth, fifth, and sixth steps can be repeated a number of times if the flatness limit is not met and the wafer can be thermally processed if the flatness limit is met. One or more corrective actions can be performed, when the number is exceeded.

When one or more of the vacuum holding elements (432a and 432b) are providing substantially the same force to the back side of the wafer, a uniform thermal processing procedure can be performed on the wafer that can be determined using uniform wafer curvature model data and/or uniform wafer flatness state wafer. In addition, measured data from one or more of the holding sensors (436a, 436b) can be used. When one or more of the vacuum holding elements (432a and 432b) are not providing substantially the same force to the back side of the wafer, a non-uniform thermal processing procedure can be performed on the wafer that can be determined using non-uniform wafer curvature model data and/or non-uniform wafer flatness state wafer. In addition, measured data from one or more of the holding sensors (436a, 436b) can be used.

In some exemplary configurations, the vacuum coupling elements (441a and 441b) can include rectangular, flared, and/or cylindrical flow channels, and the vacuum coupling elements (441a and 441b) can flow control and/or measurement devices (not shown).

The thermal processing system 400 can include two thermal control systems (450a and 450b) that can be coupled to the thermal control space 402 inside the support ring 430 using a plurality of access ports 431 through the support ring 430 and can provide a temperature control means for the backside of the wafer 401. Alternatively, additional thermal control systems may be required.

A first thermal control systems 450a can be coupled to a first thermal distribution element 455a using a first supply element 451a, and the first thermal distribution element 455a can be coupled to a plurality of first temperature control flow ports 456a. A second thermal control systems 450b can be coupled to a second thermal distribution element 455b using a second supply element 451b, and the second thermal distribution element 455b can be coupled to a plurality of second temperature control flow ports 456b. When required, supply elements (451a and 451b), thermal distribution elements (455a and 455b), and/or temperature control flow ports (456a and 456b), can include control and measurement devices (not shown). Alternatively, other thermal control means may be provided.

In some embodiments, a directed flow 459 can be established between one or more of the first temperature control flow ports 456a and one or more of the second temperature control flow ports 456b to provide a temperature control means for the backside of the wafer 401. One or more of the first temperature control flow ports 456a can provide one or more thermal control gasses and/or liquids to the process space 406 and the control space 402 beneath the wafer when a thermal processing procedure is being performed. In addition, one or more of the second temperature control flow ports 456b can be used to remove one or more thermal control gasses and/or liquids from the process space 406 and the control space 402 beneath the wafer when a thermal processing procedure is being performed. Alternatively, other directed flows may be provided.

One or more of the controllers 490 can be coupled to the first thermal control systems 450a, the first supply elements 451a, the first thermal distribution element 455a, or the first temperature control flow ports 456a, or any combination thereof, and one or more of the controllers 490 can be coupled to the second thermal control systems 450b, the second supply elements 451b, the second thermal distribution element 455b, or the second temperature control flow ports 456b, or any combination thereof. In this manner, one or more of the first temperature control flow ports 456a and/or one or more of the second temperature control flow ports 456b can be used to heat the wafer 401 during thermal processing. Control procedures can be performed to determine which flow ports are being used during operational procedures or maintenance procedures.

In some procedures, a first set of the first temperature control flow ports 456a and/or a second set of the second temperature control flow ports 456a can be activated when a wafer is held on the support ring 430 using the vacuum holding elements (432a and 432b). When the wafer is held by the support ring, one or more of the vacuum holding elements (432a and 432b) can provide a holding force to the backside of the wafer. When substantially all of the vacuum holding elements (432a and 432b) are providing substantially the same force to the backside of the wafer, a first wafer flatness state can be established, and a first thermal profile can be determined for a "flat" wafer using a first wafer curvature model. In addition, when substantially all of the holding sensors (436a, 436b) are measuring substantially the same data, the wafer can be thermally processed as a "flat" wafer. When one or more of the vacuum holding elements (432a and 432b) are not providing substantially the same force to the back side of the wafer, other wafer flatness states can be established, and other thermal profiles can be determined for a "non-uniform" wafer. In addition, when one or more of the holding sensors (436a, 436b) are not measuring substantially the same data, the wafer can be thermally processed as a "non-flat" wafer.

In some exemplary procedures, a first number of the temperature control flow ports (456a and 456b) can be activated when a wafer is held by the support ring 430, and a first directed flow can be established to the backside of the wafer. For example, the first number of activated ports can be determined using one or more wafer curvature models. In a second step, temperature profile can be determined for the wafer using one or more of the sensor pins 466 and/or one or more of the lift pins 467 coupled to the backside of the wafer. In the third step, the temperature profile can be compared to one or more limits and a first thermal uniformity map can be established for the wafer. In a fourth step, a new directed flow can be determined and the new directed flow can be determined using the first thermal uniformity map. In a fifth step, the new directed flow can be established, a new number of the temperature control flow ports (456a and 456b) can be activated, and a new thermal uniformity map can be determined. For example, when one or more of the sensor pins 466 and/or one or more of the lift pins 467 are measuring new data, the new thermal uniformity map can be determined using the new data. In a sixth step, the new thermal uniformity map can be compared to accuracy limits. Then, the fourth, fifth, and sixth steps can be repeated a number of times if the accuracy limits are not met and the wafer can be removed from the thermal processing system if the accuracy limits are met. One or more corrective actions can be performed, when a number of retries is exceeded.

In other embodiments, one or more of the evacuation systems 420 can be used to remove one or more thermal control gasses and/or liquids from the control space 402 beneath the wafer when a thermal processing procedure is being performed.

In some examples, one or more of the thermal distribution elements (455a and 455b) can be coupled to the control space 402 through the lower portion of the support ring. Alternatively, one or more of the thermal distribution elements (455a and 455b) can be coupled to the control space 402 through another portion of the support ring. For example, the supply elements (451a and 451b), the thermal distribution elements (455a and 455b), and/or the temperature control flow ports (456a and 456b) can include rectangular, flared, and/or cylindrical flow channels.

The processing chamber 405 can include a wafer transfer port 409 that can be opened during wafer transfer procedures and closed during wafer processing. In addition, the processing chamber 405 can include a one or more measurement subsystems 408 that can be configured to provide measurement data for the processing chamber 405 and/or the wafer 401.

Figure 5B:
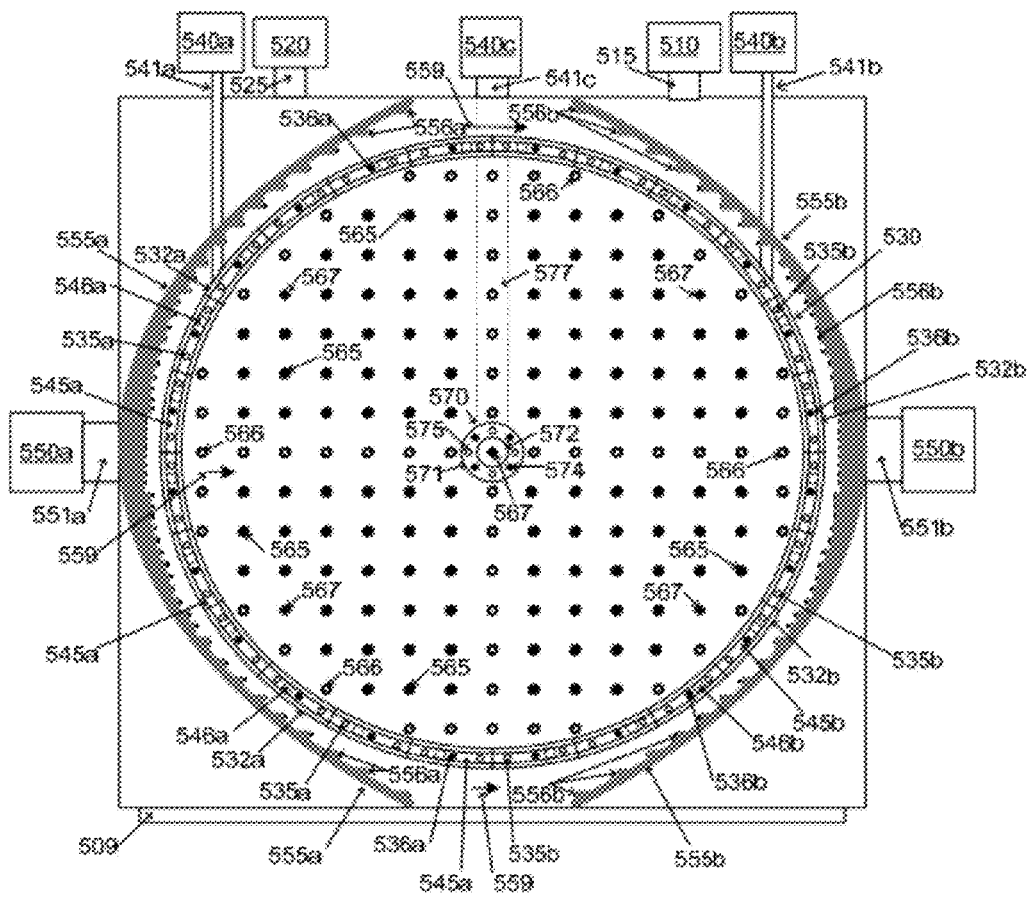
FIG. 5a and FIG. 5b show additional exemplary block diagrams of a thermal processing system in accordance with embodiments of the invention.
Figure 5A:
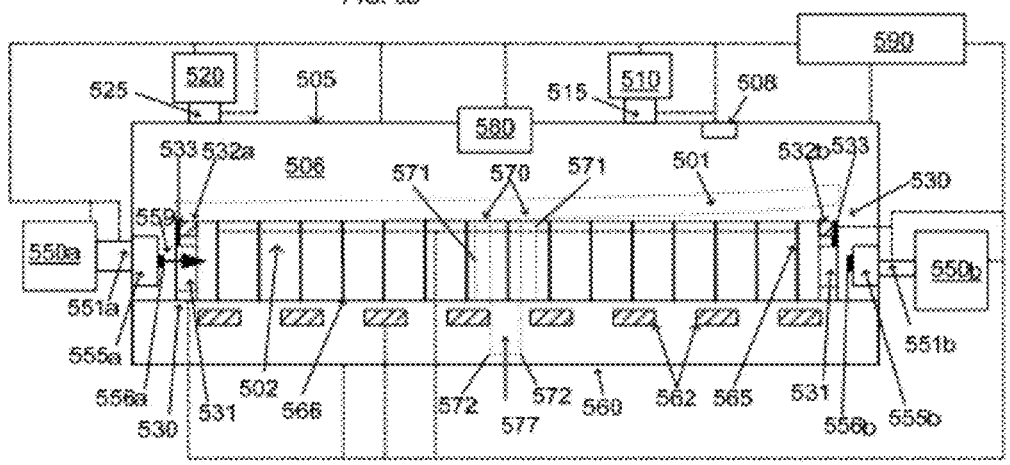

FIG. 5a and FIG. 5b show additional exemplary block diagrams of a thermal processing system in accordance with embodiments of the invention. In the illustrated embodiment, simplified block diagrams are used for illustration purposes and a simplified thermal processing system 500 is shown that comprises a processing chamber 505, a process gas supply system 510, an evacuation system 520, a first support ring 530, a second support ring 570, one or more vacuum systems (540a, 540b), one or more thermal control systems (550a, 550b), a base plate 560, a plurality of support pins 565, a plurality of sensor pins 566, and a plurality of lift pins 567. Alternatively, lift pins 567 may not be required. In addition, the thermal processing system 500 can include one or more controllers 590 that can be used to operate and maintain the thermal processing system 500.

The thermal processing system 500 can include one or more process gas supply systems 510 coupled to the process space 506 in the processing chamber 505 using one or more flow control elements 515. For example, the flow control elements 515 may comprise one or more valves (not shown) and/or one or more input sensors (not shown). Those skilled in the art will recognize that one or more nozzles, one or more showerhead devices, and/or one or more valves may be used for controlling flow in and/or out of the process space 506, and one or more input sensors may be used for determining the processing state for the thermal processing system 500. In addition, one or more of the flow control elements 515 may comprise flexible hoses. One or more of the controllers 590 can be coupled to one or more process gas supply systems 510 and the associated flow control elements 515. The process gas supply systems 510 and the associated flow control elements 515 can be used to provide process gasses and/or liquids to process space 506. One or more of the controllers 590 can be used to control the types of process gases in the process space during operational procedures or maintenance procedures.

The thermal processing system 500 can include one or more evacuation systems 520 coupled to the process space 506 in the processing chamber 505 using one or more evacuation ports 525. For example, the exhaust port 525 may comprise one or more valves (not shown) and/or one or more exhaust sensors (not shown). Those skilled in the art will recognize that one or more pumps and one or more valves may be used for controlling flow in and/or out of the process space 506, and one or more exhaust sensors may be used for determining the processing state for the thermal processing system 500. In addition, one or more of the evacuation ports 525 may be coupled to an evacuation unit (not shown) and/or an exhaust system (not shown) using flexible hoses. Evacuation port 525 can be used to exhaust cleaning and/or other processing gasses that must be removed from the process space 506. Port diameter can range from approximately 1 mm to approximately 10 mm.

The thermal processing system 500 can include a gas injection system 580 coupled to the processing chamber 505 and the controller 590. The gas injection system 580 can be configured for exposing the first support ring 530, the base plate 560, the support pins 565, the sensor pins 566, and/or the lift pins 567 to an inert gas stream for rapidly cooling these components when a wafer 501 is not present in the processing chamber 505. For example, the inert gas can include argon (Ar) or nitrogen ($N_2$).

One or more of the controllers 590 can be coupled to the evacuation systems 520 and the associated evacuation ports 525. The evacuation systems 520 and the associated evacuation ports 525 can be used to remove process gasses from the process space 506. One or more of the controllers 590 can control the process pressure and/or types of process gases in the process space during operational procedures or maintenance procedures using one or more of the evacuation systems 520 and the associated evacuation ports 525.

The first support ring 530 can comprise a plurality of vacuum holding elements (532*a* and 532*b*) and each vacuum holding element can comprise one or more vacuum ports (535*a*, 535*b*) and one or more holding sensors (536*a*, 536*b*). The holding force (vacuum pressure) in each of the vacuum holding elements (532*a* and 532*b*) can be individually measured and controlled. The inside diameter of the first support ring 530 can vary from approximately 290 mm to approximately 298 mm, the outside diameter of the support ring 530 can vary from approximately 305 mm to approximately 315 mm. The diameter of the vacuum ports (535*a*, 535*b*) can vary from approximately 2 mm to approximately 5 mm. The length of the sensor pins 566 can vary from approximately 2 mm to approximately 10 mm, the diameter of the support pins can vary from approximately 0.15 mm to approximately 1.0 mm.

The first support ring 530 can comprise one or more heating elements 533 that can be used to independently control the temperature at the wafer edge. For example, the wafer edge temperature can be independently controlled to eliminate or control the formation of an edge bead.

The second support ring 570 can comprise a second number of vacuum ports 575 and one or more third holding sensors 574. The holding force (vacuum pressure) in the second support ring 570 can be individually measured and controlled. The inside diameter 572 of the second support ring 570 can vary from approximately 4 mm to approximately 6 mm, the outside diameter 571 of the second support ring 570 can vary from approximately 6 mm to approximately 8 mm. The diameter of the vacuum ports 575 can vary from approximately 2 mm to approximately 5 mm. The height of the second support ring 570 can vary from approximately 2 mm to approximately 10 mm.

The base plate 560 can be coupled to an interior surface of the processing chamber 505, and the base plate 560 can include one or more temperature control elements 562 that can be used to quickly raise or lower the temperature of the base plate 560.

The thermal processing system 500 can include a plurality of supports pins 565 and a plurality of sensor pins 566 that can be used to support the wafer 501. The plurality of support pins 565 and the plurality of sensor pins 566 can be coupled to the base plate 560. In one example, a rectangular configuration may be used. In various embodiments, the sensor pins 566 can include contact sensors, pressure sensors, or temperature sensors, or any combination thereof. One or more of the controllers 590 can be coupled to one or more of the support pins 565 and one or more of the sensor pins 566. The sensor pins 566 can be used to determine a wafer curvature model for the wafer when the wafer is positioned, and the wafer curvature model can be used to determine the number, the location, and the activation times of one or more of the vacuum holding elements (532*a* and 532*b*).

The length of the support pins 565 can vary from approximately 2 mm to approximately 10 mm, the diameter of the support pins can vary from approximately 0.15 mm to approximately 1.0 mm. The length of the sensor pins 566 can vary from approximately 2 mm to approximately 10 mm, the diameter of the support pins can vary from approximately 0.15 mm to approximately 1.0 mm.

In some examples, the base plate and the support pins 565 can be configured to allow the support pins 565 to move in a vertical direction, and/or the base plate and the sensor pins 566 can be configured to allow the sensor pins 566 to move in a vertical direction. For example, the amount of pin movement can be used to determine wafer curvature.

The thermal processing system 500 can include two vacuum systems (540*a* and 540*b*) that can be coupled to the first support ring 530 in different halves to provide a holding means for the wafer 501. Alternatively, other holding means may be provided. A first vacuum system 540*a* can be coupled to a first distribution module 545*a* using a first vacuum coupling element 541*a*. The first distribution module 545*a* can be coupled to a first set of vacuum holding elements 532*a* using one or more first control elements 546*a*. A second vacuum system 540*b* can be coupled to a second distribution module 545*b* using a second vacuum coupling element 541*b*. The second distribution module 545*b* can be coupled to a second set of vacuum holding elements 532*b* using one or more second control elements 546*b*. Alternatively, separate vacuum systems may not be required.

In some embodiments, the thermal processing system 500 can include a third vacuum system 540*c* that can be coupled to the second support ring 570 located in the center portion, and the second support ring 570 can provide additional holding means for the wafer 501. Alternatively, other support rings may be provided. The third vacuum system 540*c* can be coupled to a third distribution element 577 using a third vacuum coupling element 541*c*, and the third distribution element 577 can be coupled to the second support ring 570. Alternatively, separate vacuum systems may not be required.

One or more of the controllers 590 can be coupled to the first vacuum system 540*a*, the first vacuum coupling elements 541*a*, the first control elements 546*a*, or the first set of vacuum holding elements 532*a*, or any combination thereof, and one or more of the controllers 590 can be coupled to the second vacuum system 540*b*, the second vacuum coupling elements 541*b*, the second control elements 546*b*, or the second set of vacuum holding elements 532*b*, or any combination thereof. In this manner, one or more of the first set of vacuum holding elements 532*a* and/or one or more of the second set of vacuum holding elements 532*b* can be used to hold the wafer 501 using vacuum techniques. Control procedures can be performed to determine which vacuum holding elements are being used during operational procedures or maintenance procedures.

In some procedures, all of the vacuum ports (535*a*, 535*b*) in the first support ring 530 and all of the vacuum ports 575 in the second support ring 570 can be activated when a wafer is positioned above the first support ring 530 using the lift pins 567. When the wafer is lowered onto the support ring, one or more of the vacuum ports (535*a*, 535*b*, and 575) can provide a holding force to the backside of the wafer. When substantially all of the vacuum ports (535*a*, 535*b*, and 575) are providing substantially the same force to the backside of the wafer, a first wafer flatness state can be established, and a first wafer curvature model can be determined for a "flat" wafer. For example, when substantially all of the holding sensors (536*a*, 536*b*, and 574) are measuring substantially the same data, the first wafer flatness state can be established, and the first wafer curvature model can be determined for a "flat" wafer. When one or more of the vacuum ports (535*a*, 535*b*, and 575) are not providing substantially the same force to the back side of the wafer, other wafer flatness states can be established, and other wafer curvature models can be determined for a "non-uniform" wafer. For example, when one or more of the holding sensors (536*a*, 536*b*, and 574) are not measuring substantially the same data, the other wafer flatness states can be established, and the other wafer curvature models can be determined for the "non-flat" wafer.

In other procedures, the other steps can be performed. In a first step, a first number of the vacuum ports (535a, 535b) in the first support ring 530 and a second number of the vacuum ports 575 in the second support ring 570 can be activated when a wafer is positioned above the support rings (530 and 570) using the lift pins 567. For example, the first and second numbers can be determined using a predicted wafer curvature model. In a second step, a wafer can be lowered onto the support rings (530 and 570), and one or more of the vacuum ports (535a, 535b, and 575) can provide a holding force to the backside of the wafer. In the third step, the data from one or more of the holding sensors (536a, 536b, and 574) can be used to determine a first total holding force, a first wafer flatness state, and/or a first wafer curvature for a "partially held" wafer. In a fourth step, a new number of vacuum ports (535a, 535b, and 575) can be activated, and the new number can be determined using the first total holding force, the first wafer flatness state, and/or the first wafer curvature for a "partially held" wafer. In a fifth step, the new activated vacuum ports (535a, 535b, and 575) can provide a new total holding force to the back side of the wafer, and a new wafer flatness state and/or a new wafer curvature model can be determined using the new total holding force. For example, when one or more of a new number of holding sensors (536a, 536b, and 574) are measuring data, the new wafer curvature model can be determined for the "partially held" wafer. In a sixth step, the new wafer flatness state can be compared to a flatness limit. Then, the fourth, fifth, and sixth steps can be repeated a number of times if the flatness limit is not met and the wafer can be thermally processed if the flatness limit is met. One or more corrective actions can be performed, when the number is exceeded.

When substantially all of the vacuum ports (535a, 535b, and 575) are providing the correct force to the backside of the wafer, a uniform thermal processing procedure can be performed on the wafer. For example, uniform wafer curvature model data and/or uniform wafer flatness data can be determined. When one or more of the vacuum ports (535a, 535b, and 575) are not providing the correct force to the backside of the wafer, a non-uniform thermal processing procedure can be performed on the wafer. For example, non-uniform wafer curvature model data and/or non-uniform wafer flatness data can be determined. In addition, measured data from one or more of the holding sensors (536a and 536b) can be used.

In some exemplary configurations, the vacuum coupling elements (541a and 541b) can include rectangular, flared, and/or cylindrical flow channels, and the vacuum coupling elements (541a and 541b) can flow control and/or measurement devices (not shown).

The thermal processing system 500 can include two thermal control systems (550a and 550b) that can be coupled to the thermal control space 502 inside the first support ring 530 using a plurality of access ports 531 through the first support ring 530 and can provide a temperature control means for the backside of the wafer 501. Alternatively, additional thermal control systems may be required.

A first thermal control systems 550a can be coupled to a first thermal distribution element 555a using a first supply element 551a, and the first thermal distribution element 555a can be coupled to a plurality of first temperature control ports 556a. A second thermal control systems 550b can be coupled to a second thermal distribution element 555b using a second supply element 551b, and the second thermal distribution element 555b can be coupled to a plurality of second temperature control ports 556b. When required, supply elements (551a and 551b), thermal distribution elements (555a and 555b), and/or temperature control flow ports (556a and 556b), can include control and measurement devices (not shown). Alternatively, other thermal control means may be provided.

In some embodiments, a directed flow 559 can be established between one or more of the first temperature control flow ports 556a and one or more of the second temperature control flow ports 556b to provide a temperature control means for the backside of the wafer 501. One or more of the first temperature control flow ports 556a can provide one or more thermal control gasses and/or liquids to the process space 506 and the control space 502 beneath the wafer when a thermal processing procedure is being performed. In addition, one or more of the second temperature control flow ports 556b can be used to remove one or more thermal control gasses and/or liquids from the process space 506 and the control space 502 beneath the wafer when a thermal processing procedure is being performed. Alternatively, other directed flows may be provided.

One or more of the controllers 590 can be coupled to the first thermal control systems 550a, the first supply elements 551a, the first thermal distribution element 555a, or the first temperature control flow ports 556a, or any combination thereof, and one or more of the controllers 590 can be coupled to the second thermal control systems 550b, the second supply elements 551b, the second thermal distribution element 555b, or the second temperature control flow ports 556b, or any combination thereof. In this manner, one or more of the first temperature control flow ports 556a and/or one or more of the second temperature control flow ports 556b can be used to heat the wafer 501 during thermal processing. Control procedures can be performed to determine which flow ports are being used during operational procedures or maintenance procedures.

In some procedures, a first set of the first temperature control flow ports 556a and/or a second set of the second temperature control flow ports 556b can be activated when a wafer is held on the first support ring 530 using the vacuum holding elements (532a and 532b). When the wafer is held by the first support ring 530, one or more of the vacuum holding elements (532a and 532b) can provide a holding force to the backside of the wafer. When substantially all of the vacuum holding elements (532a and 532b) are providing substantially the same force to the backside of the wafer, a first wafer flatness state can be established, and a first thermal profile can be determined for a "flat" wafer using a first wafer curvature model. In addition, when substantially all of the holding sensors (536a and 536b) are measuring substantially the same data, the wafer can be thermally processed as a "flat" wafer. When one or more of the vacuum holding elements (532a and 532b) are not providing substantially the same force to the back side of the wafer, other wafer flatness states can be established, and other thermal profiles can be determined for a "non-uniform" wafer. In addition, when one or more of the holding sensors (536a and 536b) are not measuring substantially the same data, the wafer can be thermally processed as a "non-flat" wafer.

In some exemplary procedures, a first number of the temperature control flow ports (556a and 556b) can be activated when a wafer is held by the support rings (530 and 570), and a first directed flow can be established to the backside of the wafer. For example, the first number of activated ports can be determined using one or more wafer curvature models. In a second step, temperature profile can be determined for the wafer using one or more of the sensor pins 566 and/or one or more of the lift pins 567 coupled to the backside of the wafer. In the third step, the temperature profile can be compared to one or more limits and a first thermal uniformity map can be established for the wafer. In a fourth step, a new directed flow can be determined and the new directed flow can be determined using the first thermal uniformity map. In a fifth step, the new directed flow can be established, a new number of the temperature control flow ports (556a and 556b) can be activated, and a new thermal uniformity map can be determined. For example, when one or more of the sensor pins 566 and/or one or more of the lift pins 567 are measuring new data, the new thermal uniformity map can be determined using the new data. In a sixth step, the new thermal uniformity map can be compared to accuracy limits. Then, the fourth, fifth, and sixth steps can be repeated a number of times if the accuracy limits are not met and the wafer can be removed from the thermal processing system if the accuracy limits are met. One or more corrective actions can be performed, when a number of retries is exceeded.

In other embodiments, one or more of the evacuation systems 520 can be used to remove one or more thermal control gasses and/or liquids from the control space 502 beneath the wafer when a thermal processing procedure is being performed.

In some examples, one or more of the thermal distribution elements (555a and 555b) can be coupled to the control space 502 through the lower portion of the support ring. Alternatively, one or more of the thermal distribution elements (555a and 555b) can be coupled to the control space 502 through another portion of the support ring. For example, the supply elements (551a and 551b), the thermal distribution elements (555a and 555b), and/or the temperature control flow ports (556a and 556b) can include rectangular, flared, and/or cylindrical flow channels.

The processing chamber 505 can include a wafer transfer port 509 that can be opened during wafer transfer procedures and closed during wafer processing. In addition, the processing chamber 505 can include a one or more measurement subsystems 508 that can be configured to provide measurement data for the processing chamber 505 and/or the wafer 501.

Figure 6B:
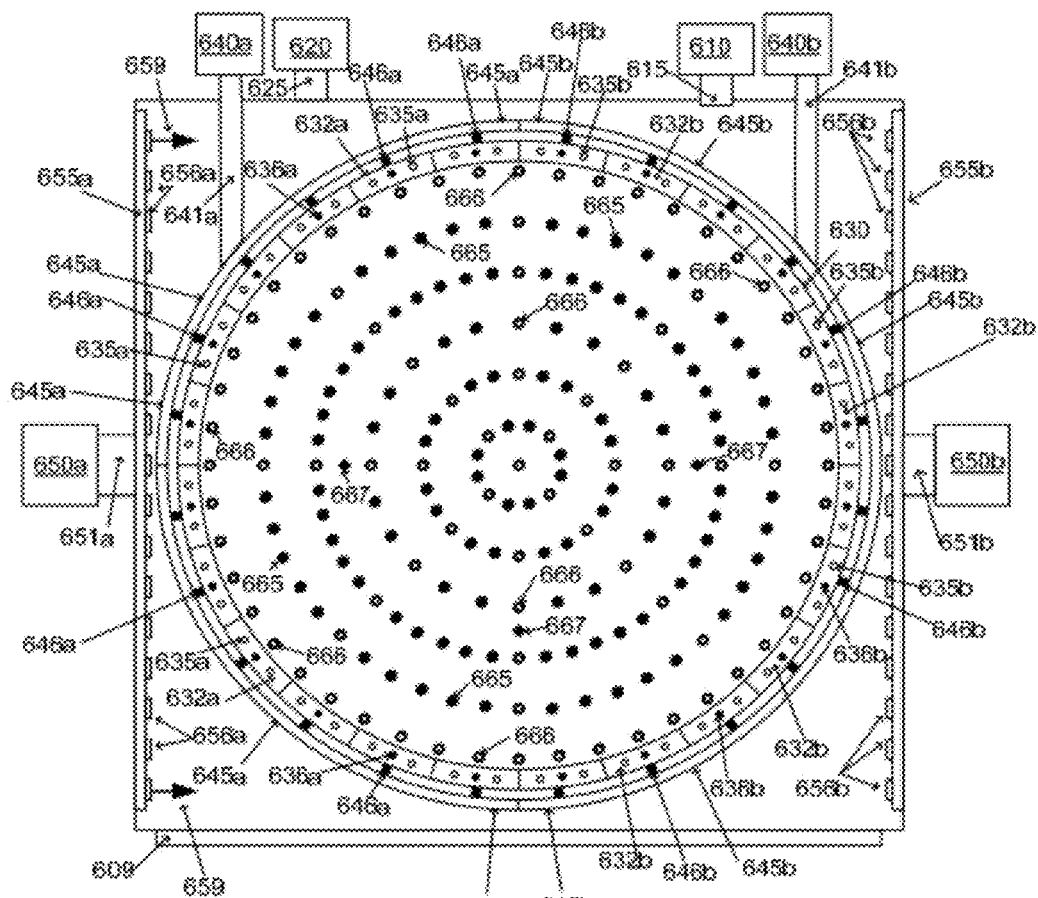
FIG. 6a and FIG. 6b show exemplary block diagrams of another thermal processing system in accordance with embodiments of the invention.
Figure 6A:
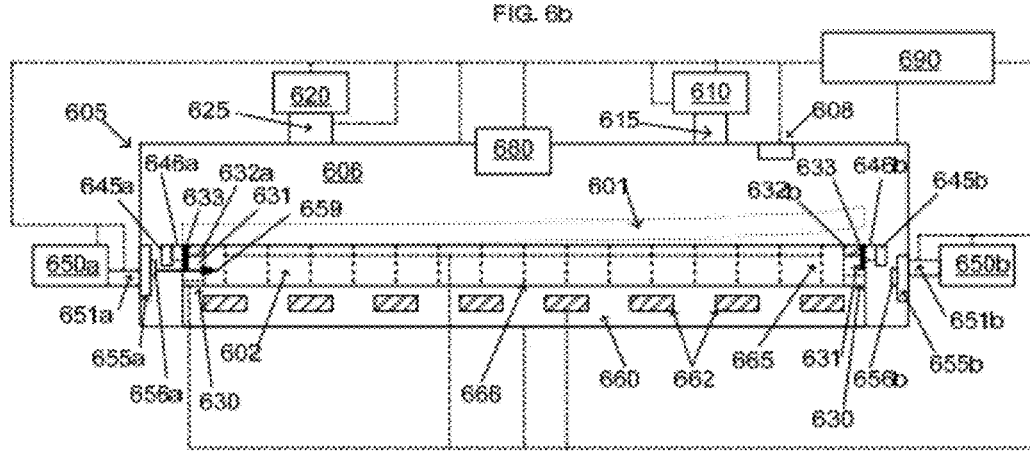

FIG. 6a and FIG. 6b show exemplary block diagrams of another thermal processing system in accordance with embodiments of the invention. In the illustrated embodiment, simplified block diagrams are used for illustration purposes and a simplified thermal processing system 600 is shown that comprises a processing chamber 605, a process gas supply system 610, an evacuation system 620, a support ring 630, one or more vacuum systems (640a, 640b), one or more thermal control systems (650a, 650b), a base plate 660, a plurality of support pins 665, a plurality of sensor pins 666, and a plurality of lift pins 667. Alternatively, lift pins 667 may not be required. In addition, the thermal processing system 600 can include one or more controllers 690 that can be used to operate and maintain the thermal processing system 600.

The thermal processing system 600 can include one or more process gas supply systems 610 coupled to the process space 606 in the processing chamber 605 using one or more flow control elements 615. For example, the flow control elements 615 may comprise one or more valves (not shown) and/or one or more input sensors (not shown). Those skilled in the art will recognize that one or more nozzles, one or more showerhead devices, and/or one or more valves may be used for controlling flow in and/or out of the process space 606, and one or more input sensors may be used for determining the processing state for the thermal processing system 600. In addition, one or more of the flow control elements 615 may comprise flexible hoses. One or more of the controllers 690 can be coupled to one or more process gas supply systems 610 and the associated flow control elements 615. The process gas supply systems 610 and the associated flow control elements 615 can be used to provide process gasses and/or liquids to process space 606. One or more of the controllers 690 can be used to control the types of process gases in the process space during operational procedures or maintenance procedures.

The thermal processing system 600 can include one or more evacuation systems 620 coupled to the process space 606 in the processing chamber 605 using one or more evacuation port 625. For example, the evacuation port 625 may comprise one or more valves (not shown) and/or one or more exhaust sensors (not shown). Those skilled in the art will recognize that one or more pumps and one or more valves may be used for controlling flow in and/or out of the process space 606, and one or more exhaust sensors may be used for determining the processing state for the thermal processing system 600. In addition, one or more of the evacuation ports 625 may be coupled to an evacuation unit (not shown) and/or an exhaust system (not shown) using flexible hoses. Evacuation port 625 can be used to exhaust cleaning and/or other processing gasses that must be removed from the process space 606. Port diameter can range from approximately 1 mm to approximately 10 mm.

The thermal processing system 600 can include a gas injection system 680 coupled to the processing chamber 605 and the controller 690. The gas injection system 680 can be configured for exposing the support ring 630, the base plate 660, the support pins 665, the sensor pins 666, and/or the lift pins 667 to an inert gas stream for rapidly cooling these components when a wafer 601 is not present in the processing chamber 605. For example, the inert gas can include argon (Ar) or nitrogen ($N_2$).

One or more of the controllers 690 can be coupled to the evacuation systems 620 and the associated evacuation ports 625. The evacuation systems 620 and the associated evacuation ports 625 can be used to remove process gases from the process space 606. One or more of the controllers 690 can control the process pressure and/or types of process gases in the process space during operational procedures or maintenance procedures using one or more of the evacuation systems 620 and the associated evacuation ports 625.

The support ring 630 can comprise a plurality of vacuum holding elements (632a and 632b) and each vacuum holding element can comprise one or more vacuum ports (635a, 635b) and one or more holding sensors (636a, 636b). The holding force (vacuum pressure) in each of the vacuum holding elements (632a and 632b) can be individually measured and controlled. The inside diameter of the support ring 630 can vary from approximately 290 mm to approximately 298 mm, the outside diameter of the support ring 630 can vary from approximately 305 mm to approximately 315 mm. The diameter of the vacuum ports (635a, 635b) can vary from approximately 2 mm to approximately 5 mm. The length of the sensor pins 666 can vary from approximately 2 mm to approximately 10 mm, the diameter of the support pins can vary from approximately 0.15 mm to approximately 1.0 mm.

The support ring 630 can comprise one or more heating elements 633 that can be used to independently control the temperature at the wafer edge. For example, the wafer edge temperature can be independently controlled to eliminate or control the formation of an edge bead.

The base plate 660 can be coupled to an interior surface of the processing chamber 605, and the base plate 660 can include one or more temperature control elements 662 that can be used to quickly raise or lower the temperature of the base plate 660.

The thermal processing system 600 can include a plurality of supports pins 665 and a plurality of sensor pins 666 that can be used to support the wafer 601. The plurality of support pins 665 and the plurality of sensor pins 666 can be coupled to the base plate 660. In one example, a circular configuration may be used. In various embodiments, the sensor pins 666 can include contact sensors, pressure sensors, or temperature sensors, or any combination thereof. One or more of the controllers 690 can be coupled to one or more of the support pins 665 and one or more of the sensor pins 666. The sensor pins 666 can be used to determine a wafer curvature model for the wafer when the wafer is positioned, and the wafer curvature model can be used to determine the number, the location, and the activation times of one or more of the vacuum holding elements (632a and 632b).

The length of the support pins 665 can vary from approximately 2 mm to approximately 10 mm, the diameter of the support pins can vary from approximately 0.15 mm to approximately 1.0 mm. The length of the sensor pins 666 can vary from approximately 2 mm to approximately 10 mm, the diameter of the support pins can vary from approximately 0.15 mm to approximately 1.0 mm.

In some examples, the base plate and the support pins 665 can be configured to allow the support pins 665 to move in a vertical direction, and/or the base plate and the sensor pins 666 can be configured to allow the sensor pins 666 to move in a vertical direction. For example, the amount of pin movement can be used to determine wafer curvature.

The thermal processing system 600 can include two vacuum systems (640a and 640b) that can be coupled to the support ring 630 in different halves to provide a holding means for the wafer 601. Alternatively, other holding means may be provided. A first vacuum system 640a can be coupled to a first distribution module 645a using a first vacuum coupling element 641a. The first distribution module 645a can be coupled to a first set of vacuum holding elements 632a control elements 646a using one or more first control elements 646a. A second vacuum system 640b can be coupled to a second distribution module 645b using a second vacuum coupling element 641b. The second distribution module 645b can be coupled to a second set of vacuum holding elements 632b using one or more second control elements 646b. Alternatively, separate vacuum systems may not be required.

One or more of the controllers 690 can be coupled to the first vacuum system 640a, the first vacuum coupling elements 641a, the first control elements 646a, or the first set of vacuum holding elements 632a, or any combination thereof, and one or more of the controllers 690 can be coupled to the second vacuum system 640b, the second vacuum coupling elements 641b, the second control elements 646b, or the second set of vacuum holding elements 632b, or any combination thereof. In this manner, one or more of the first set of vacuum holding elements 632a and/or one or more of the second set of vacuum holding elements 632b can be used to hold the wafer 601 using vacuum techniques. Control procedures can be performed to determine which vacuum holding elements are being used during operational procedures or maintenance procedures.

In some procedures, all of the vacuum holding elements (632a and 632b) can be activated when a wafer is positioned above the support ring 630 using the lift pins 667. When the wafer is lowered onto the support ring, one or more of the vacuum holding elements (632a and 632b) can provide a holding force to the backside of the wafer. When substantially all of the vacuum holding elements (632a and 632b) are providing substantially the same force to the backside of the wafer, a first wafer flatness state can be established, and a first wafer curvature model can be determined for a "flat" wafer. For example, when substantially all of the holding sensors (636a and 636b) are measuring substantially the same data, the first wafer flatness state can be established, and the first wafer curvature model can be determined for a "flat" wafer. When one or more of the vacuum holding elements (632a and 632b) are not providing substantially the same force to the back side of the wafer, other wafer flatness states can be established, and other wafer curvature models can be determined for a "non-uniform" wafer. For example, when one or more of the holding sensors (636a and 636b) are not measuring substantially the same data, the other wafer flatness states can be established, and the other wafer curvature models can be determined for the "non-flat" wafer.

In other procedures, the other steps can be performed. In a first step, a first number of the vacuum holding elements (632a and 632b) can be activated when a wafer is positioned above the support ring 630 using the lift pins 667. For example, the first number can be determined using a predicted wafer curvature model. In a second step, a wafer can be lowered onto the support ring 630, and one or more of the first number of vacuum holding elements (632a and 632b) can provide a holding force to the backside of the wafer. In the third step, one or more of the first number of vacuum holding elements (632a and 632b) can provide a first total holding force to the backside of the wafer, a first wafer flatness state and/or a first wafer curvature model can be determined for a "partially held" wafer. For example, when one or more of the first number of holding sensors (636a and 636b) are measuring substantially the same data, the first wafer flatness state can be established for the "partially held" wafer, and the first wafer curvature model can be determined for the "partially held" wafer. In a fourth step, a new number of the vacuum holding elements (632a and 632b) can be activated, and the new number can be determined using the first wafer curvature model. In a fifth step, one or more of the new number of vacuum holding elements (632a and 632b) can provide a new total holding force to the back side of the wafer, a new wafer flatness state and/or a new wafer curvature model can be determined using the new total holding force. For example, when one or more of the new number of holding sensors (636a and 636b) are measuring data, the new wafer curvature model can be determined for the "partially held" wafer. In a sixth step, the new wafer flatness state can be compared to a flatness limit. Then, the fourth, fifth, and sixth steps can be repeated a number of times if the flatness limit is not met and the wafer can be thermally processed if the flatness limit is met. One or more corrective actions can be performed, when the number is exceeded.

When one or more of the vacuum holding elements (632a and 632b) are providing substantially the same force to the back side of the wafer, a uniform thermal processing procedure can be performed on the wafer that can be determined using uniform wafer curvature model data and/or uniform wafer flatness state wafer. In addition, measured data from one or more of the holding sensors (636a and 636b) can be used. When one or more of the vacuum holding elements (632a and 632b) are not providing substantially the same force to the back side of the wafer, a non-uniform thermal processing procedure can be performed on the wafer that can be determined using non-uniform wafer curvature model data and/or non-uniform wafer flatness state wafer. In addition, measured data from one or more of the holding sensors (636a and 636b) can be used.

In some exemplary configurations, the vacuum coupling elements (641a and 641b) can include rectangular, flared, and/or cylindrical flow channels, and the vacuum coupling elements (641a and 641b) can flow control and/or measurement devices (not shown).

The thermal processing system 600 can include two thermal control systems (650a and 650b) that can be coupled to the thermal control space 602 inside the support ring 630 using a plurality of access ports 631 through the support ring 630 and can provide a temperature control means for the backside of the wafer 601. Alternatively, additional thermal control systems may be required.

A first thermal control system 650a can be coupled to a first thermal distribution element 655a using a first supply element 651a, and the first thermal distribution element 655a can be coupled to a plurality of first temperature control ports 656a. A second thermal control system 650b can be coupled to a second thermal distribution element 655b using a second supply element 651b, and the second thermal distribution element 655b can be coupled to a plurality of second temperature control ports 656b. When required, supply elements (651a and 651b), thermal distribution elements (655a and 655b), and/or temperature control flow ports (656a and 656b), can include control and measurement devices (not shown). Alternatively, other thermal control means may be provided.

In some embodiments, a directed flow 659 can be established between one or more of the first temperature control flow ports 656a and one or more of the second temperature control flow ports 656b to provide a temperature control means for the backside of the wafer 601. One or more of the first temperature control flow ports 656a can provide one or more thermal control gasses and/or liquids to the process space 606 and the control space 602 beneath the wafer when a thermal processing procedure is being performed. In addition, one or more of the second temperature control flow ports 656b can be used to remove one or more thermal control gasses and/or liquids from the process space 606 and the control space 602 beneath the wafer when a thermal processing procedure is being performed. Alternatively, other directed flows may be provided.

One or more of the controllers 690 can be coupled to the first thermal control system 650a, the first supply elements 651a, the first thermal distribution element 655a, or the first temperature control flow ports 656a, or any combination thereof, and one or more of the controllers 690 can be coupled to the second thermal control system 650b, the second supply elements 651b, the second thermal distribution element 655b, or the second temperature control flow ports 656b, or any combination thereof. In this manner, one or more of the first temperature control flow ports 656a and/or one or more of the second temperature control flow ports 656b can be used to heat the wafer 601 during thermal processing. Control procedures can be performed to determine which flow ports are being used during operational procedures or maintenance procedures.

In some procedures, a first set of the first temperature control flow ports 656a and/or a second set of the second temperature control flow ports 656a can be activated when a wafer is held on the support ring 630 using the vacuum holding elements (632a and 632b). When the wafer is held by the support ring, one or more of the vacuum holding elements (632a and 632b) can provide a holding force to the backside of the wafer. When substantially all of the vacuum holding elements (632a and 632b) are providing substantially the same force to the backside of the wafer, a first wafer flatness state can be established, and a first thermal profile can be determined for a "flat" wafer using a first wafer curvature model. In addition, when substantially all of the holding sensors (636a and 636b) are measuring substantially the same data, the wafer can be thermally processed as a "flat" wafer. When one or more of the vacuum holding elements (632a and 632b) are not providing substantially the same force to the back side of the wafer, other wafer flatness states can be established, and other thermal profiles can be determined for a "non-uniform" wafer. In addition, when one or more of the holding sensors (636a and 636b) are not measuring substantially the same data, the wafer can be thermally processed as a "non-flat" wafer.

In some exemplary procedures, a first number of the temperature control flow ports (656a and 656b) can be activated when a wafer is held by the support ring 630, and a first directed flow can be established to the backside of the wafer. For example, the first number of activated ports can be determined using one or more wafer curvature models. In a second step, temperature profile can be determined for the wafer using one or more of the sensor pins 666 and/or one or more of the lift pins 667 coupled to the backside of the wafer. In the third step, the temperature profile can be compared to one or more limits and a first thermal uniformity map can be established for the wafer. In a fourth step, a new directed flow can be determined and the new directed flow can be determined using the first thermal uniformity map. In a fifth step, the new directed flow can be established, a new number of the temperature control flow ports (656a and 656b) can be activated, and a new thermal uniformity map can be determined. For example, when one or more of the sensor pins 666 and/or one or more of the lift pins 667 are measuring new data, the new thermal uniformity map can be determined using the new data. In a sixth step, the new thermal uniformity map can be compared to accuracy limits. Then, the fourth, fifth, and sixth steps can be repeated a number of times if the accuracy limits are not met and the wafer can be removed from the thermal processing system if the accuracy limits are met. One or more corrective actions can be performed, when a number of retries is exceeded.

In other embodiments, one or more of the evacuation systems 620 can be used to remove one or more thermal control gasses and/or liquids from the control space 602 beneath the wafer when a thermal processing procedure is being performed.

In some examples, one or more of the thermal distribution elements (655a and 655b) can be coupled to the control space 602 through the lower portion of the support ring. Alternatively, one or more of the thermal distribution elements (655a and 655b) can be coupled to the control space 602 through another portion of the support ring. For example, the supply elements (651a and 651b), the thermal distribution elements (655a and 655b), and/or the temperature control flow ports (656a and 656b) can include rectangular, flared, and/or cylindrical flow channels.

The processing chamber 605 can include a wafer transfer port 609 that can be opened during wafer transfer procedures and closed during wafer processing. In addition, the processing chamber 605 can include a one or more measurement subsystems 608 that can be configured to provide measurement data for the processing chamber 605 and/or the wafer 601.

Figure 7B:
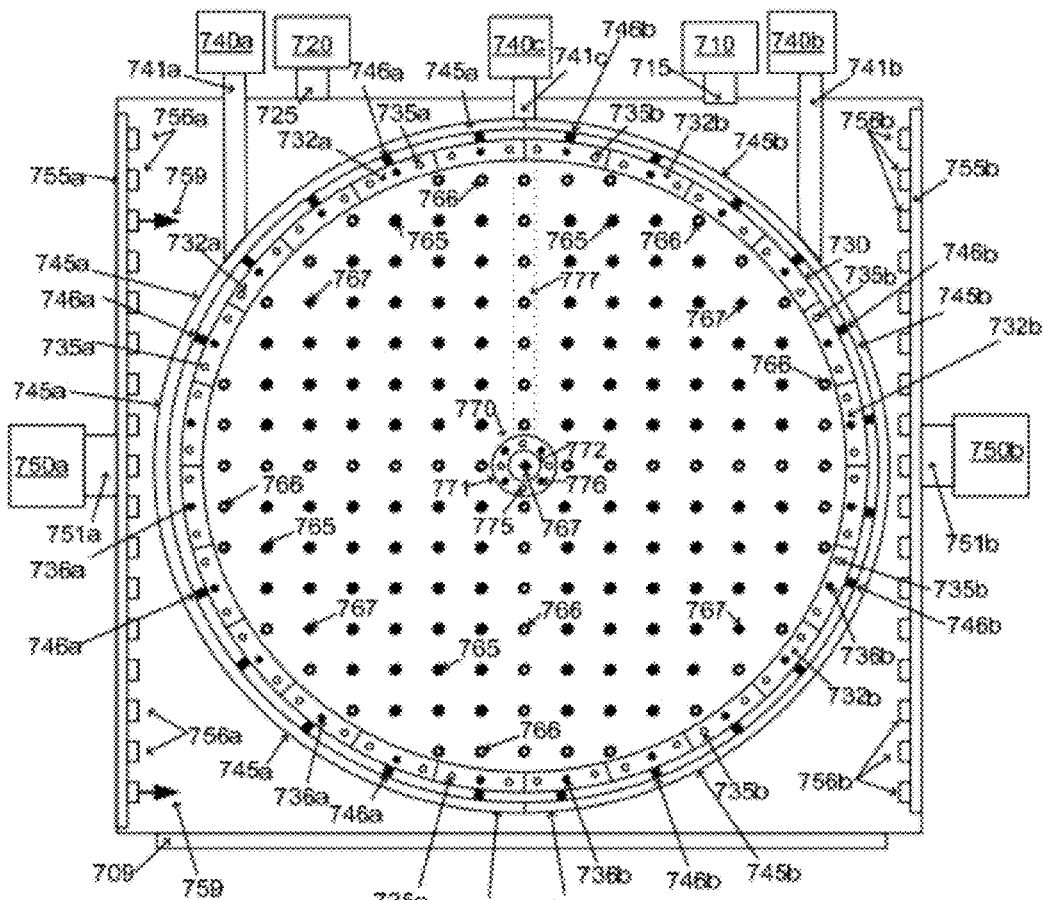
FIG. 7a and FIG. 7b show exemplary block diagrams of another thermal processing system in accordance with additional embodiments of the invention.
Figure 7A:
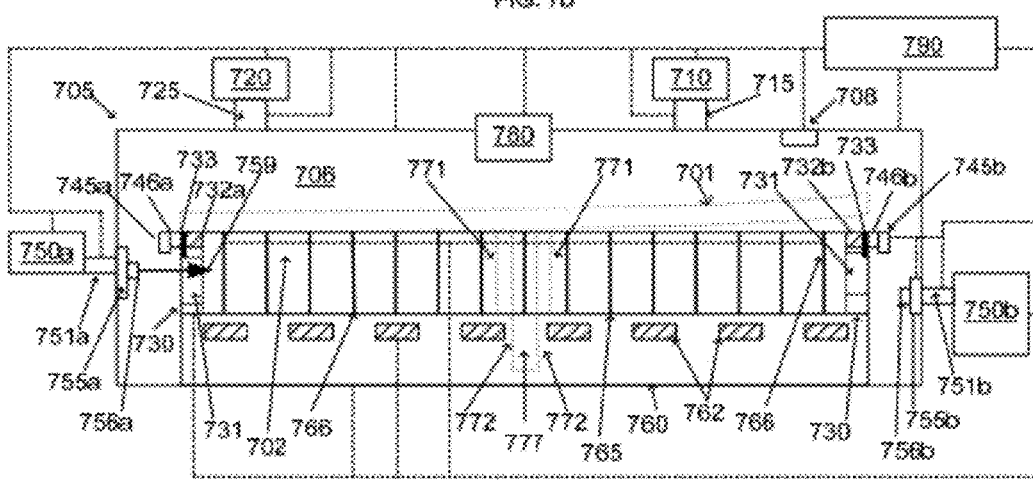

FIG. 7a and FIG. 7b show exemplary block diagrams of another thermal processing system in accordance with additional embodiments of the invention. In the illustrated embodiment, simplified block diagrams are used for illustration purposes and a simplified thermal processing system 700 is shown that comprises a processing chamber 705, a process gas supply system 710, an evacuation system 720, a first support ring 730, a second support ring 770, one or more vacuum systems (740*a*, 740*b*), one or more thermal control systems (750*a*, 750*b*), a base plate 760, a plurality of support pins 765, a plurality of sensor pins 766, and a plurality of lift pins 767. Alternatively, lift pins 767 may not be required. In addition, the thermal processing system 700 can include one or more controllers 790 that can be used to operate and maintain the thermal processing system 700.

The thermal processing system 700 can include one or more process gas supply systems 710 coupled to the process space 706 in the processing chamber 705 using one or more flow control elements 715. For example, the flow control elements 715 may comprise one or more valves (not shown) and/or one or more input sensors (not shown). Those skilled in the art will recognize that one or more nozzles, one or more showerhead devices, and/or one or more valves may be used for controlling flow in and/or out of the process space 706, and one or more input sensors may be used for determining the processing state for the thermal processing system 700. In addition, one or more of the flow control elements 715 may comprise flexible hoses. One or more of the controllers 790 can be coupled to one or more process gas supply systems 710 and the associated flow control elements 715. The process gas supply systems 710 and the associated flow control elements 715 can be used to provide process gasses and/or liquids to process space 706. One or more of the controllers 790 can be used to control the types of process gases in the process space during operational procedures or maintenance procedures.

The thermal processing system 700 can include one or more evacuation systems 720 coupled to the process space 706 in the processing chamber 705 using one or more evacuation ports 725. For example, the exhaust port 725 may comprise one or more valves (not shown) and/or one or more exhaust sensors (not shown). Those skilled in the art will recognize that one or more pumps and one or more valves may be used for controlling flow in and/or out of the process space 706, and one or more exhaust sensors may be used for determining the processing state for the thermal processing system 700. In addition, one or more of the evacuation ports 725 may be coupled to an evacuation unit (not shown) and/or an exhaust system (not shown) using flexible hoses. Evacuation port 725 can be used to exhaust cleaning and/or other processing gasses that must be removed from the process space 706. Port diameter can range from approximately 1 mm to approximately 10 mm.

The thermal processing system 700 can include a gas injection system 780 coupled to the processing chamber 705 and the controller 790. The gas injection system 780 can be configured for exposing the first support ring 730, the base plate 760, the support pins 765, the sensor pins 766, and/or the lift pins 767 to an inert gas stream for rapidly cooling these components when a wafer 701 is not present in the processing chamber 705. For example, the inert gas can include argon (Ar) or nitrogen ($N_2$).

One or more of the controllers 790 can be coupled to the evacuation systems 720 and the associated evacuation ports 725. The evacuation systems 720 and the associated evacuation ports 725 can be used to remove process gasses from the process space 706. One or more of the controllers 790 can control the process pressure and/or types of process gases in the process space during operational procedures or maintenance procedures using one or more of the evacuation systems 720 and the associated evacuation ports 725.

The first support ring 730 can comprise a plurality of vacuum holding elements (732*a* and 732*b*) and each vacuum holding element can comprise one or more vacuum ports (735*a*, 735*b*) and one or more holding sensors 736. The holding force (vacuum pressure) in each of the vacuum holding elements (732*a* and 732*b*) can be individually measured and controlled. The inside diameter of the first support ring 730 can vary from approximately 290 mm to approximately 298 mm, the outside diameter of the first support ring 730 can vary from approximately 305 mm to approximately 315 mm. The diameter of the vacuum ports (735*a*, 735*b*) can vary from approximately 2 mm to approximately 7 mm. The length of the sensor pins 766 can vary from approximately 2 mm to approximately 10 mm, the diameter of the support pins can vary from approximately 0.15 mm to approximately 1.0 mm.

The first support ring 730 can comprise one or more heating elements 733 that can be used to independently control the temperature at the wafer edge. For example, the wafer edge temperature can be independently controlled to eliminate or control the formation of an edge bead.

The second support ring 770 can comprise a second number of vacuum ports 775 and one or more third holding sensors 774. The holding force (vacuum pressure) in the second support ring 770 can be individually measured and controlled. The inside diameter 772 of the second support ring 770 can vary from approximately 4 mm to approximately 6 mm, the outside diameter 771 of the second support ring 770 can vary from approximately 6 mm to approximately 8 mm. The diameter of the vacuum ports 775 can vary from approximately 2 mm to approximately 7 mm. The height of the second support ring 770 can vary from approximately 2 mm to approximately 10 mm.

The base plate 760 can be coupled to an interior surface of the processing chamber 705, and the base plate 760 can include one or more temperature control elements 762 that can be used to quickly raise or lower the temperature of the base plate 760.

The thermal processing system 700 can include a plurality of supports pins 765 and a plurality of sensor pins 766 that can be used to support the wafer 701. The plurality of support pins 765 and the plurality of sensor pins 766 can be coupled to the base plate 760. In one example, a rectangular configuration may be used. In various embodiments, the sensor pins 766 can include contact sensors, pressure sensors, or temperature sensors, or any combination thereof. One or more of the controllers 790 can be coupled to one or more of the support pins 765 and one or more of the sensor pins 766. The sensor pins 766 can be used to determine a wafer curvature model for the wafer when the wafer is positioned, and the wafer curvature model can be used to determine the number, the location, and the activation times of one or more of the vacuum holding elements (732*a* and 732*b*).

The length of the support pins 765 can vary from approximately 2 mm to approximately 10 mm, the diameter of the support pins can vary from approximately 0.15 mm to approximately 1.0 mm. The length of the sensor pins 766 can vary from approximately 2 mm to approximately 10 mm, the diameter of the support pins can vary from approximately 0.15 mm to approximately 1.0 mm.

In some examples, the base plate 760 and the support pins 765 can be configured to allow the support pins 765 to move in a vertical direction, and/or the base plate and the sensor pins 766 can be configured to allow the sensor pins 766 to move in a vertical direction. For example, the amount of pin movement can be used to determine wafer curvature.

The thermal processing system 700 can include two vacuum systems (740*a* and 740*b*) that can be coupled to the first support ring 730 in different halves to provide a holding means for the wafer 701. Alternatively, other holding means may be provided. A first vacuum system 740*a* can be coupled to a first distribution module 745a using a first vacuum coupling element 741a. The first distribution module 745a can be coupled to a first set of vacuum holding elements using one or more first control elements 746a. A second vacuum system 740b can be coupled to a second distribution module 745b using a second vacuum coupling element 741b. The second distribution module 745b can be coupled to a second set of vacuum holding elements 732b using one or more second control elements 746b. Alternatively, separate vacuum systems may not be required.

In some embodiments, the thermal processing system 700 can include a third vacuum system 740c that can be coupled to the second support ring 770 located in the center portion, and the second support ring 770 can provide additional holding means for the wafer 701. Alternatively, other support rings may be provided. The third vacuum system 740c can be coupled to a third distribution element 777 using a third vacuum coupling element 741c, and the third distribution element 777 can be coupled to the second support ring 770. Alternatively, separate vacuum systems may not be required.

One or more of the controllers 790 can be coupled to the first vacuum system 740a, the first vacuum coupling elements 741a, the first control elements 746a, or the first set of vacuum holding elements 732a, or any combination thereof, and one or more of the controllers 790 can be coupled to the second vacuum system 740b, the second vacuum coupling elements 741b, the second control elements 746b, or the second set of vacuum holding elements 732b, or any combination thereof. In this manner, one or more of the first set of vacuum holding elements 732a and/or one or more of the second set of vacuum holding elements 732b can be used to hold the wafer 701 using vacuum techniques. Control procedures can be performed to determine which vacuum holding elements are being used during operational procedures or maintenance procedures.

In some procedures, all of the vacuum ports (735a, 735b) in the first support ring 730 and all of the vacuum ports 775 in the second support ring 770 can be activated when a wafer is positioned above the first support ring 730 using the lift pins 767. When the wafer is lowered onto the support ring, one or more of the vacuum ports (735a, 735b, and 775) can provide a holding force to the backside of the wafer. When substantially all of the vacuum ports (735a, 735b, and 775) are providing substantially the same force to the backside of the wafer, a first wafer flatness state can be established, and a first wafer curvature model can be determined for a "flat" wafer. For example, when substantially all of the holding sensors (736a, 736b, and 774) are measuring substantially the same data, the first wafer flatness state can be established, and the first wafer curvature model can be determined for a "flat" wafer. When one or more of the vacuum ports (735a, 735b, and 775) are not providing substantially the same force to the back side of the wafer, other wafer flatness states can be established, and other wafer curvature models can be determined for a "non-uniform" wafer. For example, when one or more of the holding sensors (736a, 736b, and 774) are not measuring substantially the same data, the other wafer flatness states can be established, and the other wafer curvature models can be determined for the "non-flat" wafer.

In other procedures, the other steps can be performed. In a first step, a first number of the vacuum ports (735a, 735b) in the first support ring 730 and a second number of the vacuum ports 775 in the second support ring 770 can be activated when a wafer is positioned above the support rings (730 and 770) using the lift pins 767. For example, the first and second numbers can be determined using a predicted wafer curvature model. In a second step, a wafer can be lowered onto the support rings (730 and 770), and one or more of the vacuum ports (735a, 735b, and 775) can provide a holding force to the backside of the wafer. In the third step, the data from one or more of the holding sensors (736a, 736b, and 774) can be used to determine a first total holding force, a first wafer flatness state, and/or a first wafer curvature for a "partially held" wafer. In a fourth step, a new number of vacuum ports (735a, 735b, and 775) can be activated, and the new number can be determined using the first total holding force, the first wafer flatness state, and/or the first wafer curvature for a "partially held" wafer. In a fifth step, the new activated vacuum ports (735a, 735b, and 775) can provide a new total holding force to the back side of the wafer, and a new wafer flatness state and/or a new wafer curvature model can be determined using the new total holding force. For example, when one or more of a new number of holding sensors (736a, 736b, and 774) are measuring data, the new wafer curvature model can be determined for the "partially held" wafer. In a sixth step, the new wafer flatness state can be compared to a flatness limit. Then, the fourth, fifth, and sixth steps can be repeated a number of times if the flatness limit is not met and the wafer can be thermally processed if the flatness limit is met. One or more corrective actions can be performed, when the number is exceeded.

When substantially all of the vacuum ports (735a, 735b, and 775) are providing the correct force to the backside of the wafer, a uniform thermal processing procedure can be performed on the wafer. For example, uniform wafer curvature model data and/or uniform wafer flatness data can be determined. When one or more of the vacuum ports (735a, 735b, and 775) are not providing the correct force to the backside of the wafer, a non-uniform thermal processing procedure can be performed on the wafer. For example, non-uniform wafer curvature model data and/or non-uniform wafer flatness data can be determined. In addition, measured data from one or more of the holding sensors (736a and 736b) can be used.

In some exemplary configurations, the vacuum coupling elements (741a and 741b) can include rectangular, flared, and/or cylindrical flow channels, and the vacuum coupling elements (741a and 741b) can flow control and/or measurement devices (not shown).

The thermal processing system 700 can include two thermal control systems (750a and 750b) that can be coupled to the thermal control space 702 inside the first support ring 730 using a plurality of access ports 731 through the first support ring 730 and can provide a temperature control means for the backside of the wafer 701. Alternatively, additional thermal control systems may be required.

A first thermal control systems 750a can be coupled to a first thermal distribution element 755a using a first supply element 751a, and the first thermal distribution element 755a can be coupled to a plurality of first temperature control ports 756a. A second thermal control systems 750b can be coupled to a second thermal distribution element 755b using a second supply element 751b, and the second thermal distribution element 755b can be coupled to a plurality of second temperature control ports 756b. When required, supply elements (751a and 751b), thermal distribution elements (755a and 755b), and/or temperature control flow ports (756a and 756b), can include control and measurement devices (not shown). Alternatively, other thermal control means may be provided.

In some embodiments, a directed flow 759 can be established between one or more of the first temperature control flow ports 756a and one or more of the second temperature control flow ports 756b to provide a temperature control means for the backside of the wafer 701. One or more of the first temperature control flow ports 756a can provide one or more thermal control gasses and/or liquids to the process space 706 and the control space 702 beneath the wafer when a thermal processing procedure is being performed. In addition, one or more of the second temperature control flow ports 756b can be used to remove one or more thermal control gasses and/or liquids from the process space 706 and the control space 702 beneath the wafer when a thermal processing procedure is being performed. Alternatively, other directed flows may be provided.

One or more of the controllers 790 can be coupled to the first thermal control systems 750a, the first supply elements 751a, the first thermal distribution element 755a, or the first temperature control flow ports 756a, or any combination thereof, and one or more of the controllers 790 can be coupled to the second thermal control systems 750b, the second supply elements 751b, the second thermal distribution element 755b, or the second temperature control flow ports 756b, or any combination thereof. In this manner, one or more of the first temperature control flow ports 756a and/or one or more of the second temperature control flow ports 756b can be used to heat the wafer 701 during thermal processing. Control procedures can be performed to determine which flow ports are being used during operational procedures or maintenance procedures.

In some procedures, a first set of the first temperature control flow ports 756a and/or a second set of the second temperature control flow ports 756a can be activated when a wafer is held on the first support ring 730 using the vacuum holding elements (732a and 732b). When the wafer is held by the first support ring 730, one or more of the vacuum holding elements (732a and 732b) can provide a holding force to the backside of the wafer. When substantially all of the vacuum holding elements (732a and 732b) are providing substantially the same force to the backside of the wafer, a first wafer flatness state can be established, and a first thermal profile can be determined for a "flat" wafer using a first wafer curvature model. In addition, when substantially all of the holding sensors (736a and 736b) are measuring substantially the same data, the wafer can be thermally processed as a "flat" wafer. When one or more of the vacuum holding elements (732a and 732b) are not providing substantially the same force to the back side of the wafer, other wafer flatness states can be established, and other thermal profiles can be determined for a "non-uniform" wafer. In addition, when one or more of the holding sensors (736a and 736b) are not measuring substantially the same data, the wafer can be thermally processed as a "non-flat" wafer.

In some exemplary procedures, a first number of the temperature control flow ports (756a and 756b) can be activated when a wafer is held by the support rings (730 and 770), and a first directed flow can be established to the backside of the wafer. For example, the first number of activated ports can be determined using one or more wafer curvature models. In a second step, temperature profile can be determined for the wafer using one or more of the sensor pins 766 and/or one or more of the lift pins 767 coupled to the backside of the wafer. In the third step, the temperature profile can be compared to one or more limits and a first thermal uniformity map can be established for the wafer. In a fourth step, a new directed flow can be determined and the new directed flow can be determined using the first thermal uniformity map. In a fifth step, the new directed flow can be established, a new number of the temperature control flow ports (756a and 756b) can be activated, and a new thermal uniformity map can be determined. For example, when one or more of the sensor pins 766 and/or one or more of the lift pins 767 are measuring new data, the new thermal uniformity map can be determined using the new data. In a sixth step, the new thermal uniformity map can be compared to accuracy limits. Then, the fourth, fifth, and sixth steps can be repeated a number of times if the accuracy limits are not met and the wafer can be removed from the thermal processing system if the accuracy limits are met. One or more corrective actions can be performed, when a number of retries is exceeded.

In other embodiments, one or more of the evacuation systems 720 can be used to remove one or more thermal control gasses and/or liquids from the control space 702 beneath the wafer when a thermal processing procedure is being performed.

In some examples, one or more of the thermal distribution elements (755a and 755b) can be coupled to the control space 702 through the lower portion of the support ring. Alternatively, one or more of the thermal distribution elements (755a and 755b) can be coupled to the control space 702 through another portion of the support ring. For example, the supply elements (751a and 751b), the thermal distribution elements (755a and 755b), and/or the temperature control flow ports (756a and 756b) can include rectangular, flared, and/or cylindrical flow channels.

The processing chamber 705 can include a wafer transfer port 709 that can be opened during wafer transfer procedures and closed during wafer processing. In addition, the processing chamber 705 can include a one or more measurement subsystems 708 that can be configured to provide measurement data for the processing chamber 705 and/or the wafer 701.

FIG. 8 illustrates a simplified process flow diagram for a method for using a thermal processing system according to embodiments of the invention. Thermal processing procedures can be performed at many points during wafer processing, and the illustrated procedure 800 can be performed as required during wafer processing.

In 810, a wafer can be positioned on a support surface in a processing chamber, and the support surface can comprise a plurality of support pins, a plurality of sensor pins, and a plurality of vacuum holding elements. A wafer transfer system (not shown) can be used to transfer the wafer in and out of the processing chamber using the wafer transfer port. In some examples, an alignment procedure can be performed using a notch in the wafer.

In 815, a first wafer curvature model can be determined for the wafer using a first set of sensor pins in contact with a backside surface of the wafer.

In 820, a first holding (clamping) procedure can be performed using the first wafer curvature model, and the wafer can be coupled to the top surface of a support ring at a first set of locations using a first set of the vacuum holding elements in the support ring. For example, vacuum techniques can be used to hold the wafer.

In 825, a new wafer curvature model can be determined for the wafer using a new set of sensor pins in contact with the backside surface of the wafer.

In 830, a new holding (clamping) procedure can be performed, and the wafer can be coupled to the top surface of a support ring at a new set of locations using a new set of the vacuum holding elements in the support ring.

In 835, a flatness state can be determined for the wafer.

In 840, a query can be performed to determine if the flatness state is within a first range. When the flatness state is within a first range, procedure 800 can branch back to 825, and when the flatness state is not within the first range, procedure 800 can branch to 845.

In 845, another query can be performed to determine if the flatness state is within a second range. When the flatness state is within a second range, procedure 800 can branch to 850, and when the flatness state is not within the second range, procedure 800 can branch to 855.

In 850, the wafer can heated when the flatness state is within the second range.

In 855, one or more corrective actions can be performed, when the flatness state is within a third range.

Then, the wafer can be removed from thermal processing system.

One or more of the controllers described herein may be capable of providing data to the thermal processing system. The data can include wafer information, layer information, process information, and metrology information. Wafer information can include composition data, size data, thickness data, and temperature data. Layer information can include the number of layers, the composition of the layers, and the thickness of the layers. Process information can include data concerning previous steps and the current step. Metrology information can include optical digital profile data, such as critical dimension (CD) data, profile data, and uniformity data, and optical data, such as refractive index (n) data and extinction coefficient (k) data. For example, CD data and profile data can include information for features and open areas in one or more layers, and can also include uniformity data. Each controller may comprise a microprocessor, a memory (e.g., volatile and/or non-volatile memory), and a digital I/O port. A program stored in the memory may be utilized to control the aforementioned components of a thermal processing system according to a process recipe. A controller may be configured to analyze the process data, to compare the process data with target process data, and to use the comparison to change a process and/or control the processing system components.

In some embodiments, one or more of the support, sensor, and/or lift pins can be removably coupled to the base plate to allow the pins to be removed, cleaned, and/or replaced during maintenance procedures. In other embodiments, one or more self-cleaning procedure can be performed. For example, a fully automated self-cleaning process can be implemented to minimize human intervention and potential error. If customer defect levels require the thermal processing system to be cleaned periodically, this can be programmed to occur. Down time and productivity lost due to Preventative Maintenance (PM) cleaning activities are minimized since the fully automated cleaning process/design allows the cleaning cycle to occur without stopping the entire tool. In addition, since the tool is not "opened" or disassembled, no post cleaning process testing (verification) is required. Furthermore, maintenance personnel are not exposed to solvent vapors, polymer residues or potential lifting or handling injuries since the components are not removed and/or cleaned by maintenance personnel. In other cases, one or more of the thermal processing system components may be cleaned using external cleaning procedures. The self-cleaning frequency and the self-cleaning process can be programmable and can be executed based on time, number of wafers processed or exhaust values (alarm condition or minimum exhaust value measured during processing). Nitrogen or any other gas can also be used during a self-cleaning step.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative system and methods, and illustrative examples shown and described. Accordingly, departures may be made from such details without departing from the scope of applicants' general inventive concept.

What is claimed is:

1. A wafer support subsystem for processing a wafer comprising:
   a base plate having a circular configuration configured to be removably mounted with a processing chamber;
   a plurality of support pins coupled to an inner portion of the base plate, wherein one or more of the support pins are configured support the wafer;
   a plurality of sensor pins coupled to the inner portion of the base plate, wherein at least one sensor pin is configured to determine a wafer temperature; and
   a plurality of vacuum holding elements coupled to an outer portion of the base plate, wherein one or more of the vacuum holding elements are configured to hold the wafer using vacuum techniques and one or more of the vacuum holding elements are configured to control the wafer temperature using convection techniques.

2. A thermal processing system for processing a wafer comprising:
   a processing chamber having a support surface for positioning the wafer;
   a base plate coupled to the processing chamber;
   a plurality of support pins coupled to the base plate;
   a plurality of sensor pins coupled to the base plate;
   a support ring coupled to the base plate, the support ring having a plurality of vacuum holding elements and one or more holding sensors, wherein the support surface comprises the support ring, one or more of the support pins, and one or more of the sensor pins;
   a vacuum system coupled to the support ring;
   a thermal control system configured to provide a directed flow to a control space within the support ring; and
   a controller configured for determining a flatness state for the wafer, wherein the wafer is thermally processed if the flatness state is within a range.

3. The thermal processing system as claimed in claim 2, wherein the controller is further configured for determining a first wafer curvature model for the wafer using a first set of sensor pins in contact with a backside surface of the wafer, for performing a first holding procedure using the first wafer curvature model, wherein the wafer is coupled to the support surface at a first holding location using at least one of the vacuum holding elements, for determining a new wafer curvature model for the wafer using a new set of sensor pins in contact with the backside surface of the wafer, for performing a new holding procedure, wherein the wafer is coupled to the support surface at one or more new holding locations using at least one new vacuum holding element, and for determining the flatness state for the wafer.

4. The thermal processing system as claimed in claim 2, further comprising:
   a process gas supply system coupled to the processing chamber.

5. The thermal processing system as claimed in claim 2, further comprising:
   an evacuation system coupled to the processing chamber.

6. The thermal processing system as claimed in claim 2, further comprising:
   a plurality of lift pins coupled to the base plate.

7. The thermal processing system as claimed in claim 2, further comprising one or more input sensors and/or one or more exhaust sensors for determining a processing state.

\* \* \* \* \*